United States Patent
Kousaka et al.

(10) Patent No.: US 8,752,503 B2
(45) Date of Patent: Jun. 17, 2014

(54) PLASMA PROCESSING DEVICE, PLASMA PROCESSING METHOD, AND PLASMA SURFACE PROCESSING METHOD

(75) Inventors: Hiroyuki Kousaka, Nagoya (JP); Hitoshi Iida, Nagoya (JP); Noritsugu Umehara, Nagoya (JP)

(73) Assignee: National University Corporation Nagoya University, Nagoya-shi, Aichi (JP)

( * ) Notice: Subject to any disclaimer, the term of this patent is extended or adjusted under 35 U.S.C. 154(b) by 779 days.

(21) Appl. No.: 12/374,365

(22) PCT Filed: Jul. 19, 2007

(86) PCT No.: PCT/JP2007/064219
§ 371 (c)(1),
(2), (4) Date: Jan. 19, 2009

(87) PCT Pub. No.: WO2008/010537
PCT Pub. Date: Jan. 24, 2008

(65) Prior Publication Data
US 2009/0286011 A1 Nov. 19, 2009

(30) Foreign Application Priority Data
Jul. 20, 2006 (JP) .................... 2006-197928

(51) Int. Cl.
  *C23C 16/00* (2006.01)
  *C23F 1/00* (2006.01)
  *H01L 21/306* (2006.01)

(52) U.S. Cl.
  USPC .......... 118/723 MW; 156/345.41; 118/723 R

(58) Field of Classification Search
  USPC .......... 118/723, 723 MR, 723 ME, 723 MA, 118/728–730, 723 R; 156/345.36, 345.41, 156/345.51–345.55; 427/237, 238
  See application file for complete search history.

(56) References Cited

U.S. PATENT DOCUMENTS

| | | | | |
|---|---|---|---|---|
| 5,879,763 A | * | 3/1999 | Sugiyama et al. | 427/577 |
| 6,186,090 B1 | * | 2/2001 | Dotter et al. | 118/718 |

FOREIGN PATENT DOCUMENTS

| | | | | |
|---|---|---|---|---|
| DE | 4136297 | * | 6/1993 | H01J 37/22 |
| JP | 05-263223 | * | 10/1993 | C23C 14/34 |
| JP | 2004-47207 A | | 2/2004 | |
| JP | 2006-152418 A | | 6/2006 | |

OTHER PUBLICATIONS

Machine Translation JP 05-263223, Fujiyama et al dated Oct. 12, 1993.*

English Machine Translation DE4136297, Ranke dated May 6, 1993.*

* cited by examiner

*Primary Examiner* — Rakesh Dhingra
(74) *Attorney, Agent, or Firm* — Quarles & Brady LLP; Gavin J. Milczarek-Desai

(57) ABSTRACT

To generate plasma inside a tube of a small opening diameter and perform plasma processing inside the tube. A plasma processing device (2) is formed by a chamber (4) and a microwave generation device (6). A microwave is introduced into the chamber via a quartz tube (16). A tube holder (18) is arranged inside the quartz tube (16). Two holes are formed in the side surface of the tube holder (18). A tube (20) of a small opening diameter is fixed to the end of the tube holder (18).

14 Claims, 34 Drawing Sheets

Fig. 3
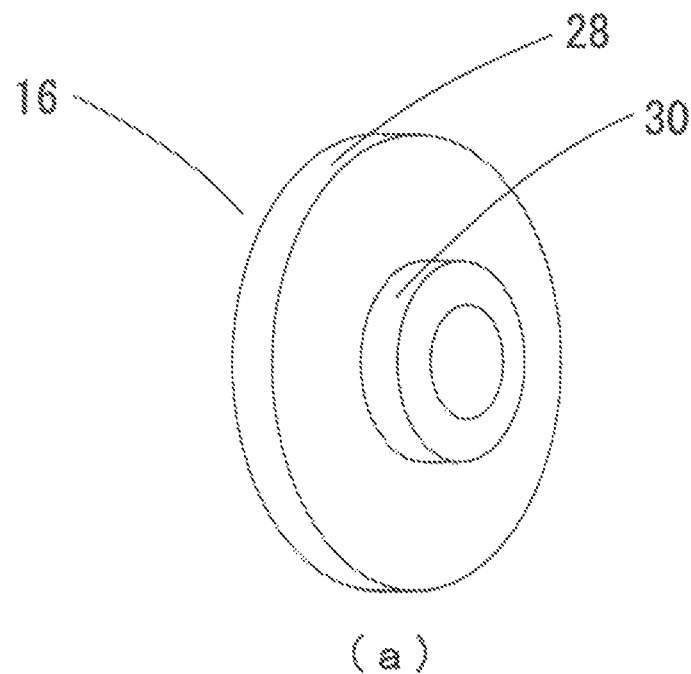
(a)
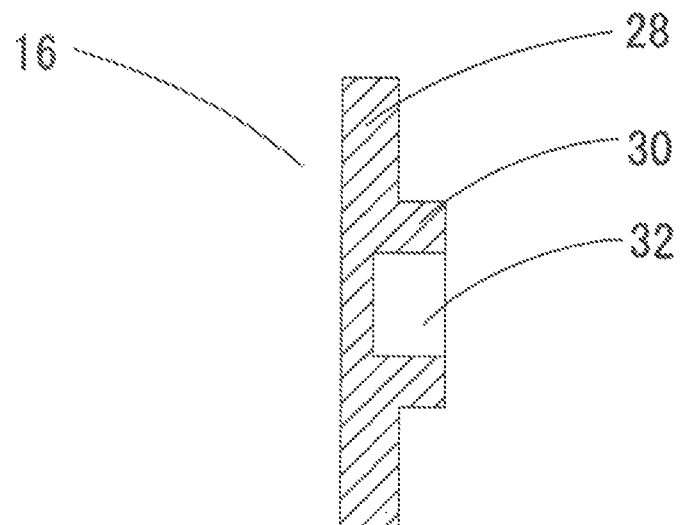
(b)

Fig. 4
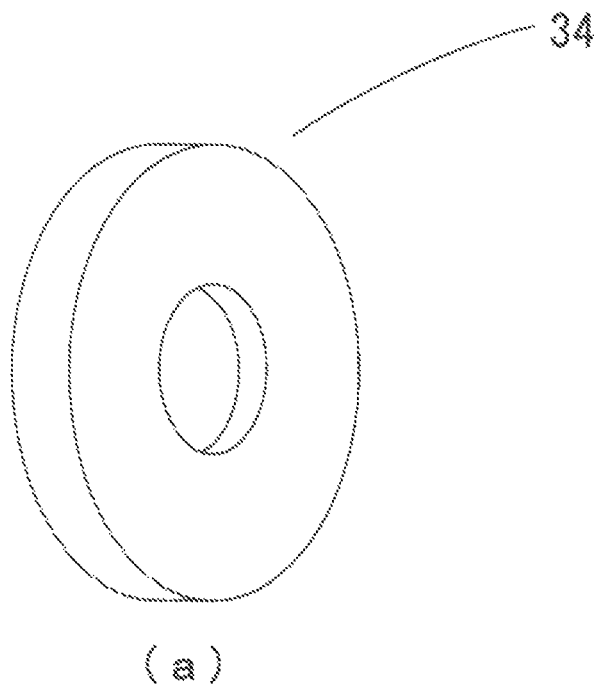
(a)
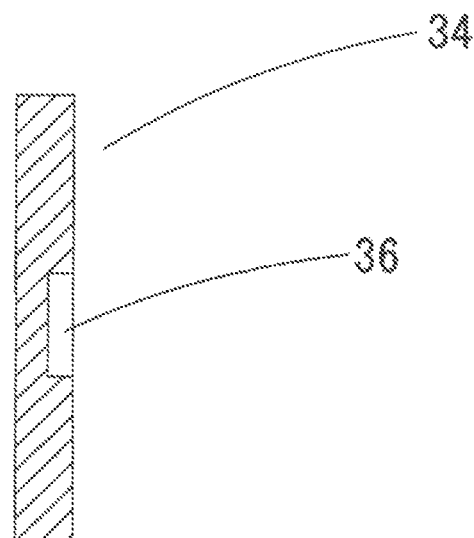
(b)

Fig. 5
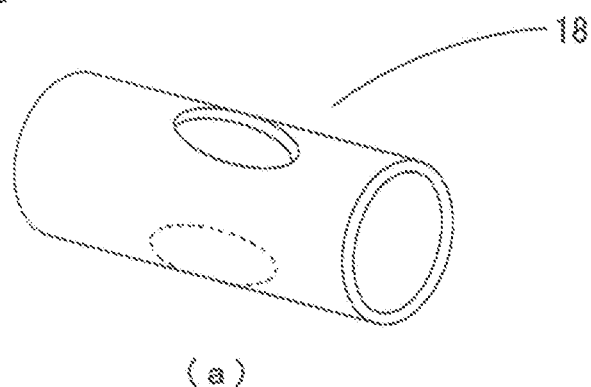
(a)
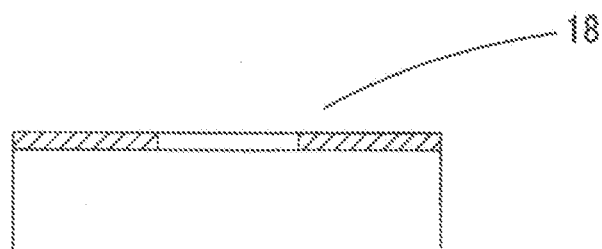
(b)

Fig. 6
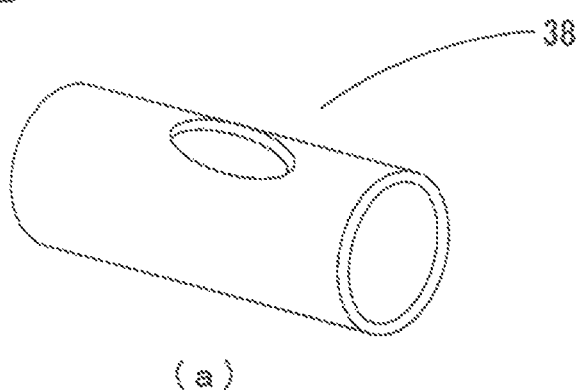
(a)
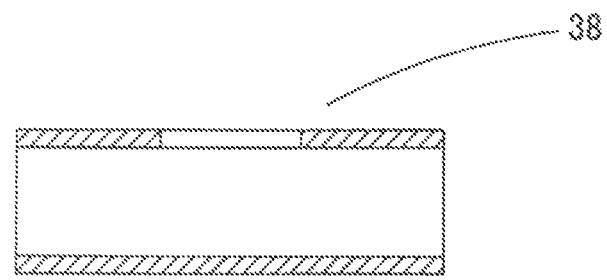
(b)

Fig. 7
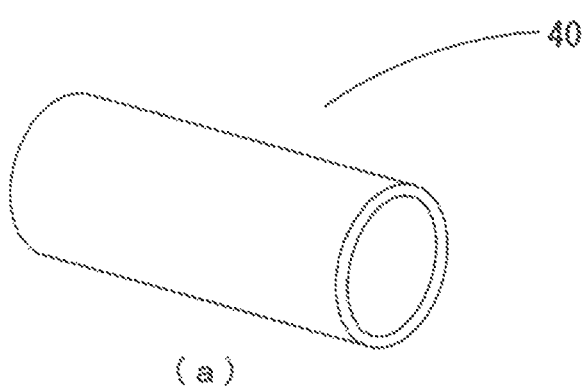
(a)
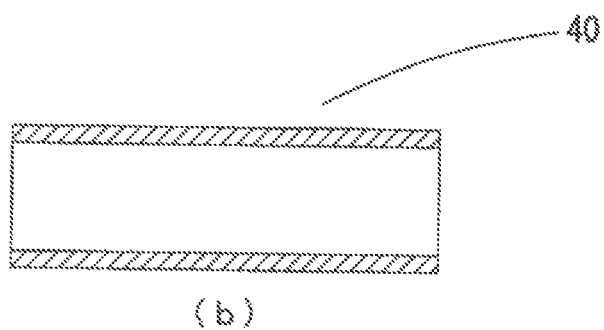
(b)

Fig. 8
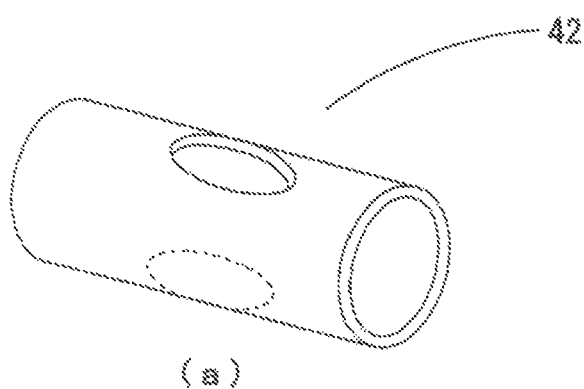
(a)
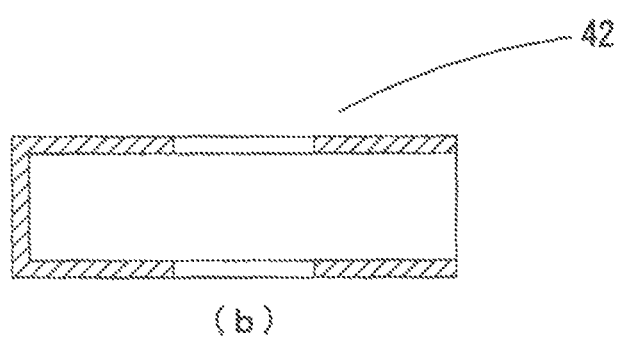
(b)

Fig. 9
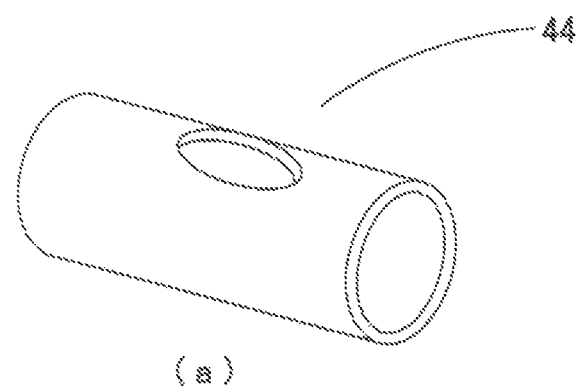
(a)
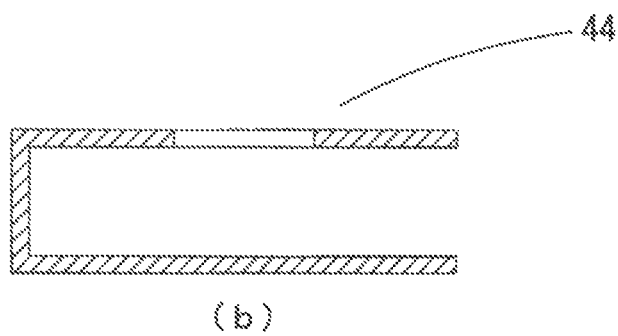
(b)

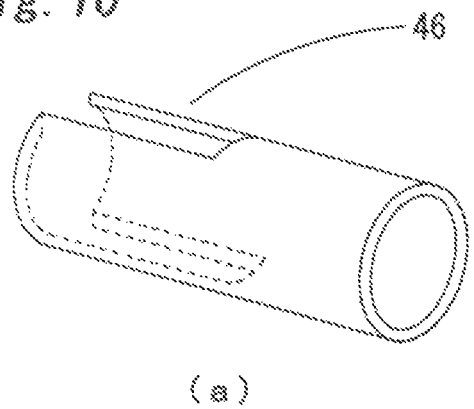
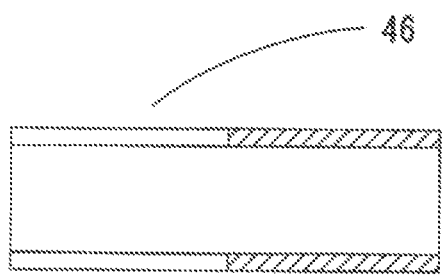
Fig. 10

Fig. 11
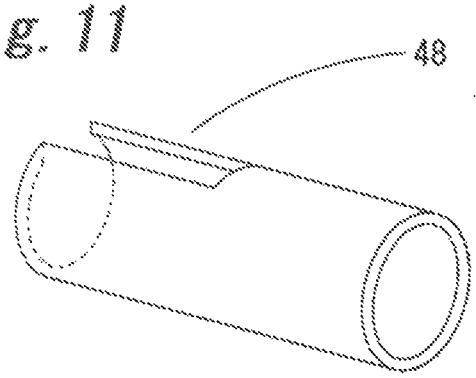
(a)
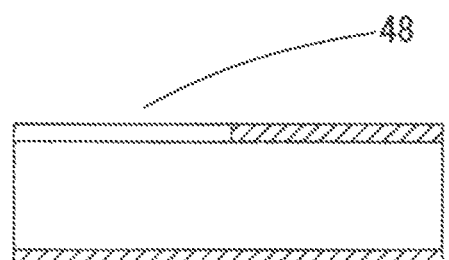
(b)

Fig. 13
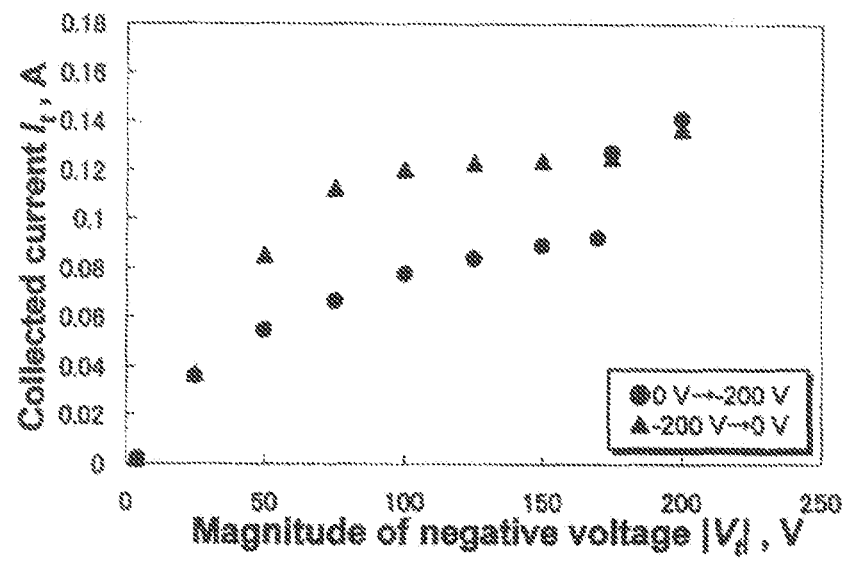
(a)
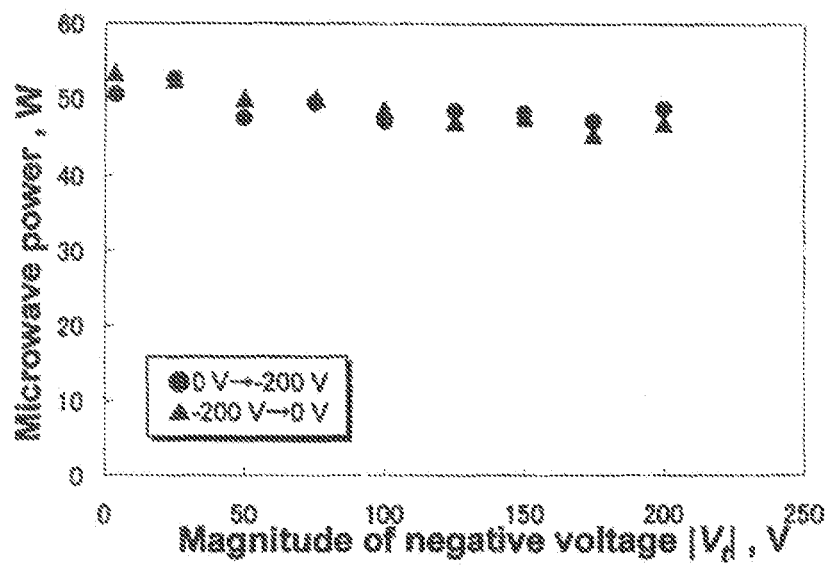
(b)

*Fig. 15*
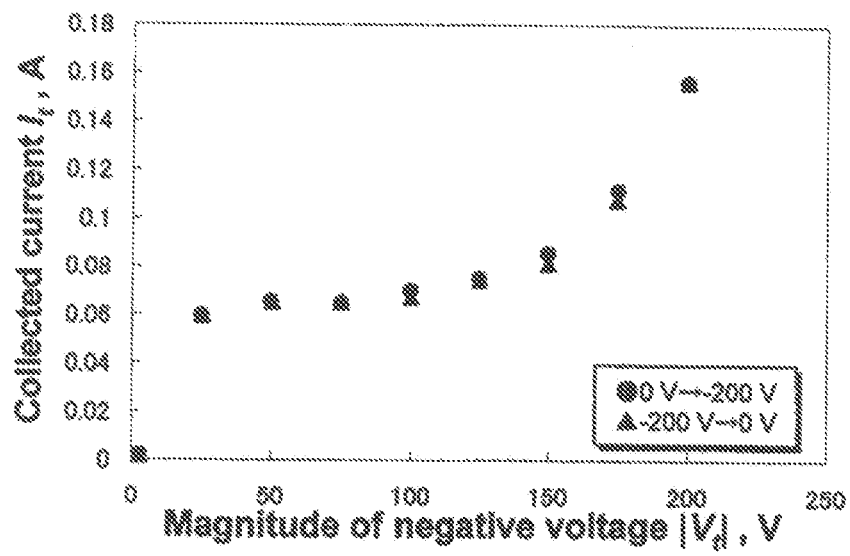
(a)
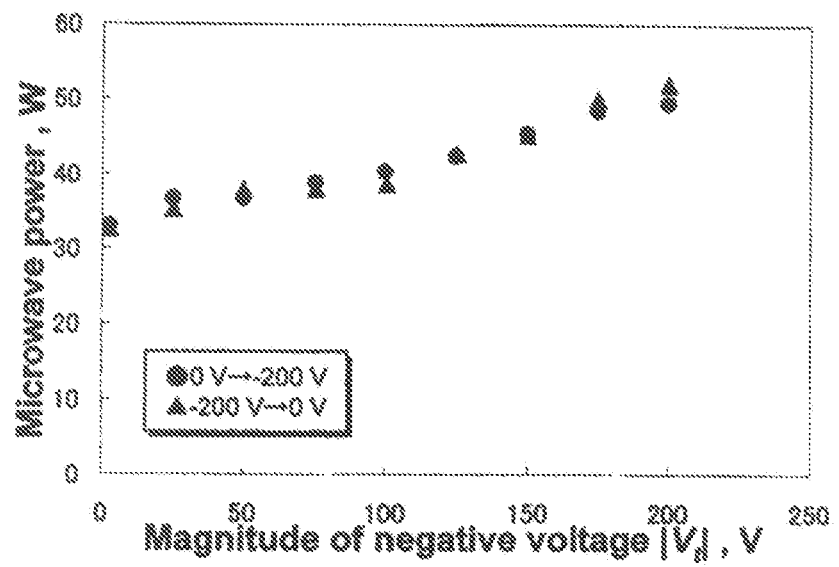
(b)

Fig. 16
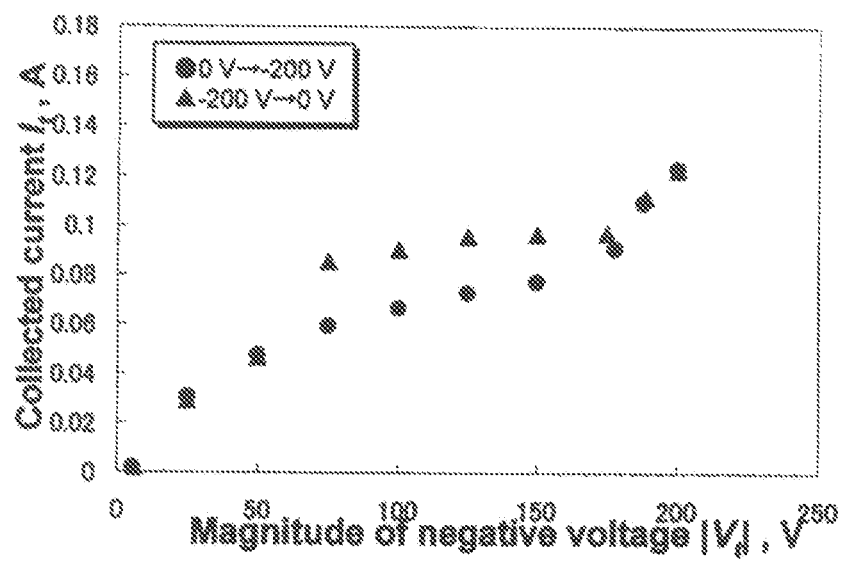
(a)
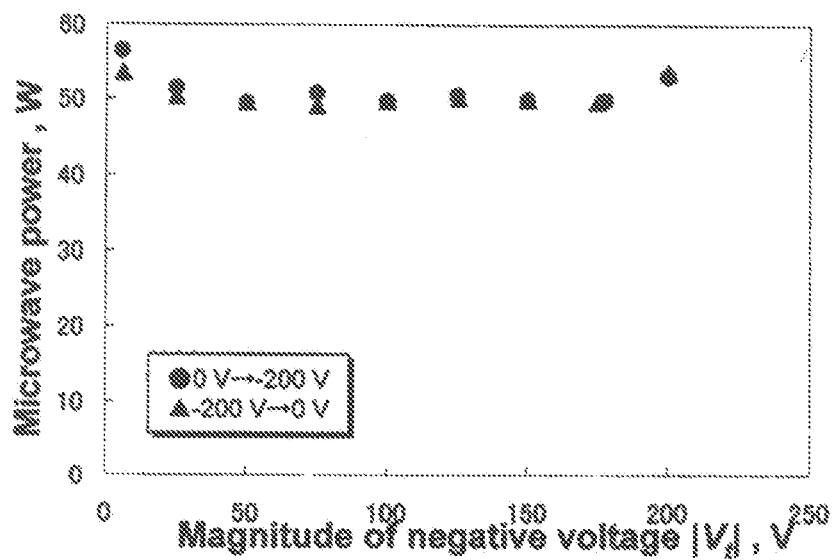
(b)

Fig. 17
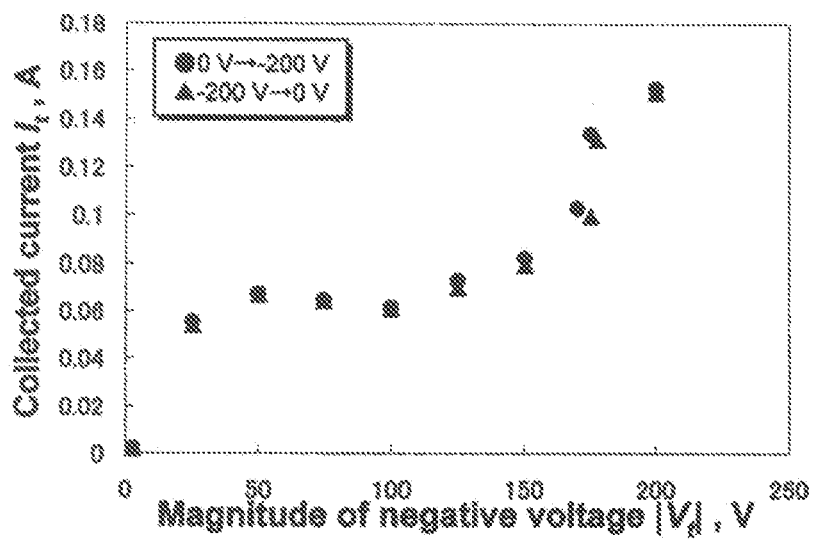
(a)
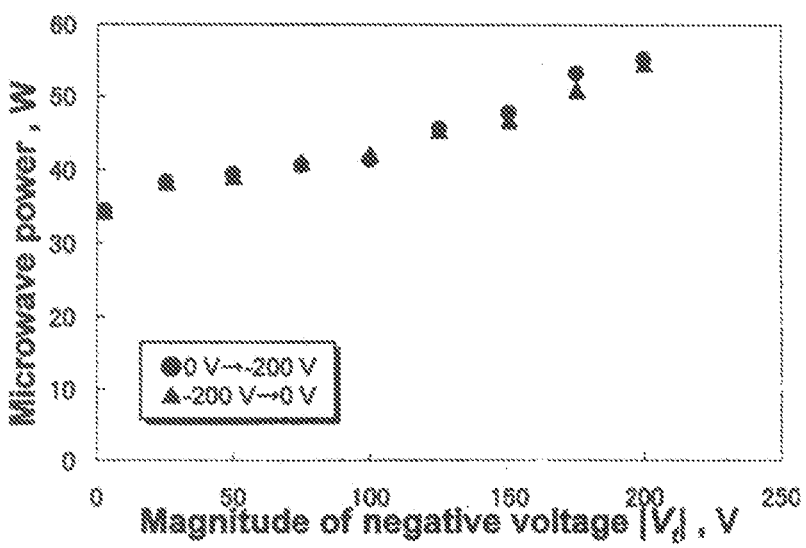
(b)

Fig. 18
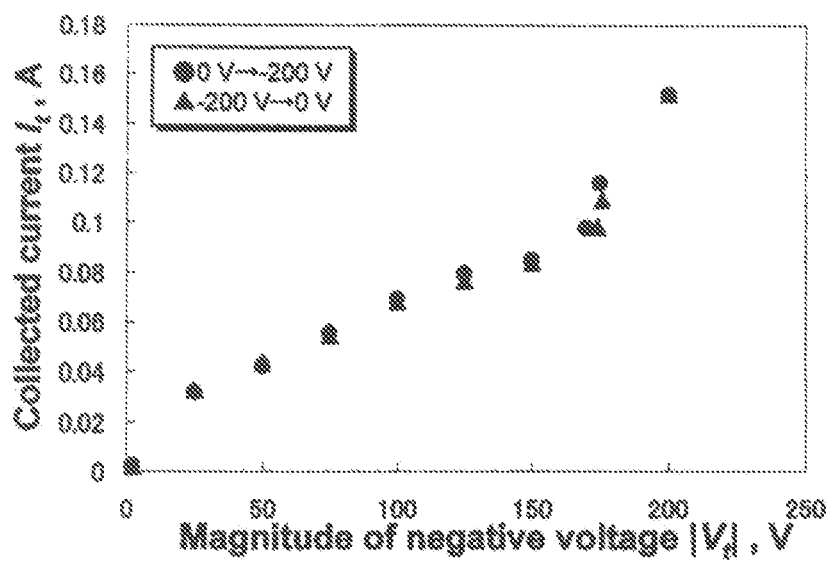
(a)
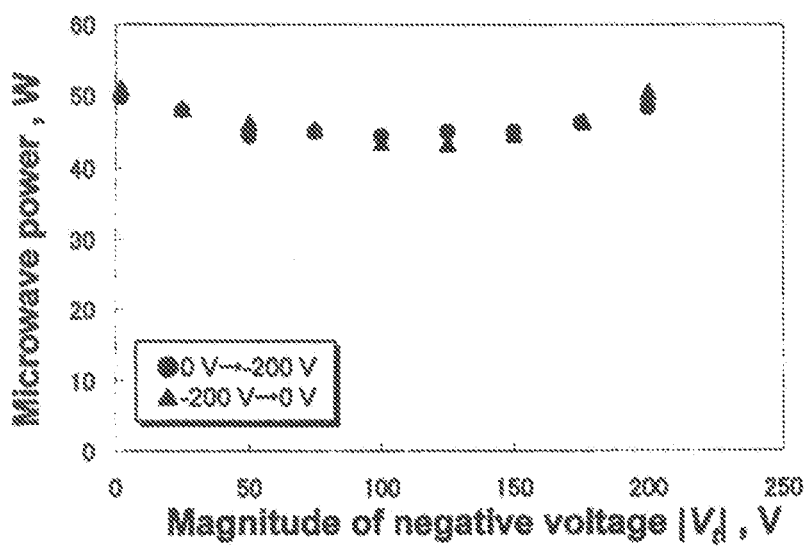
(b)

Fig. 19
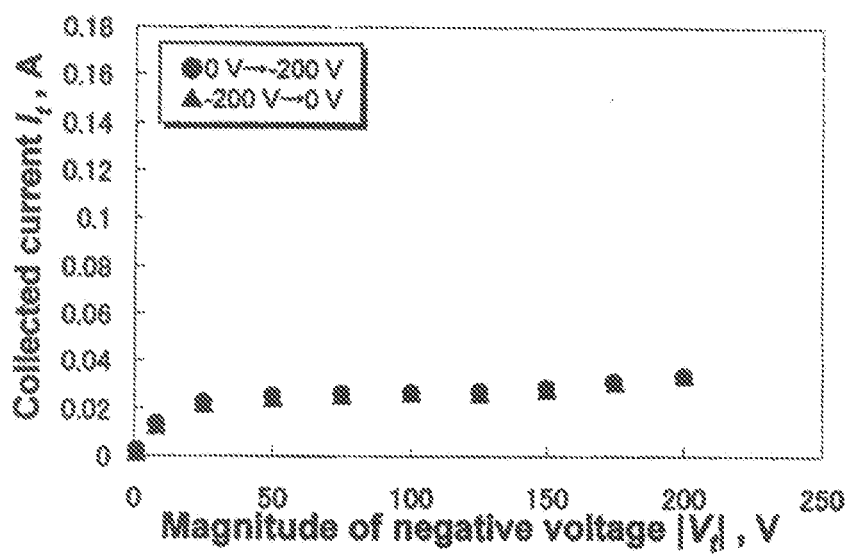
(a)
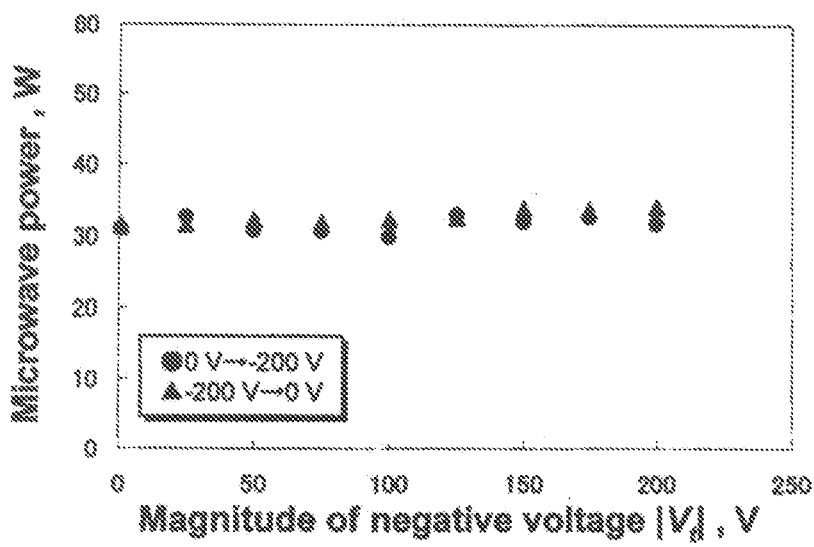
(b)

Fig. 20
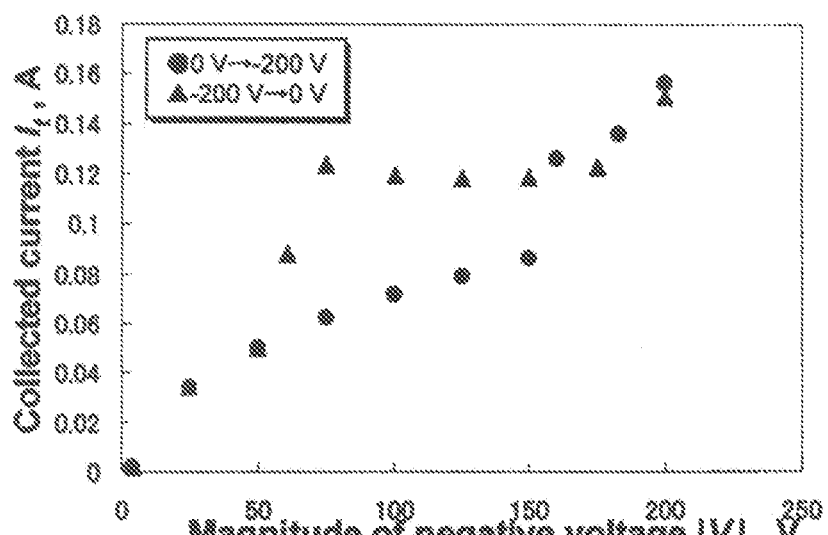
(a)
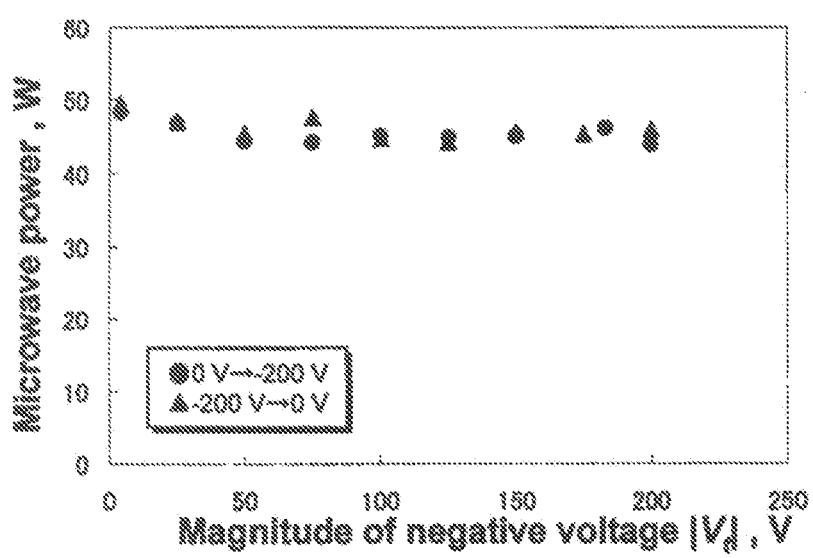
(b)

Fig. 21
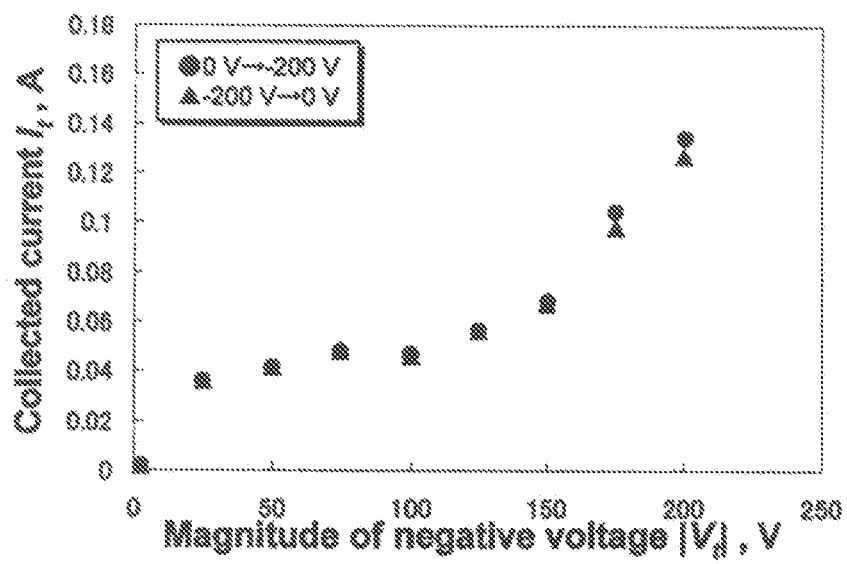
(a)
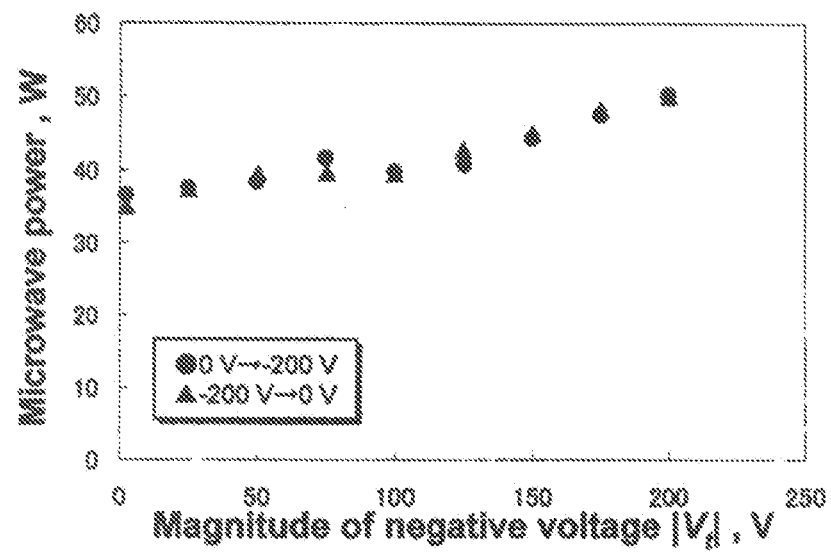
(b)

Fig. 22
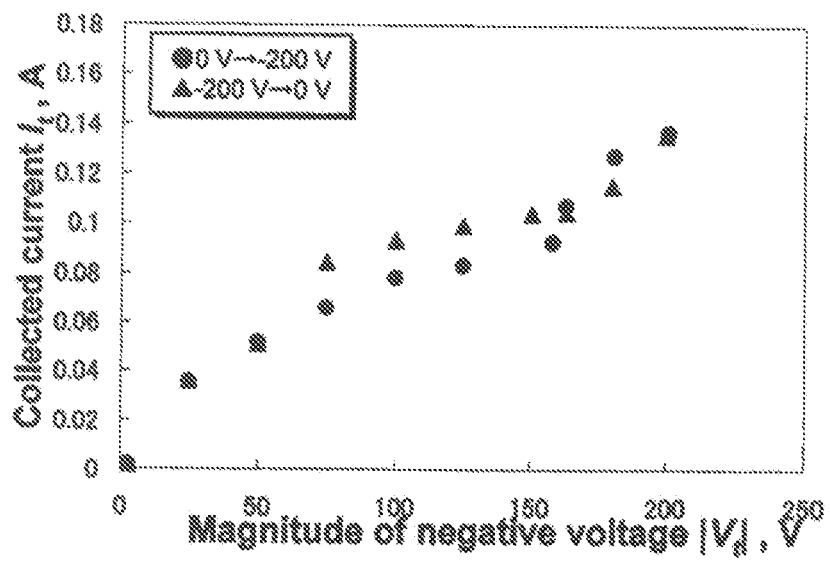
(a)
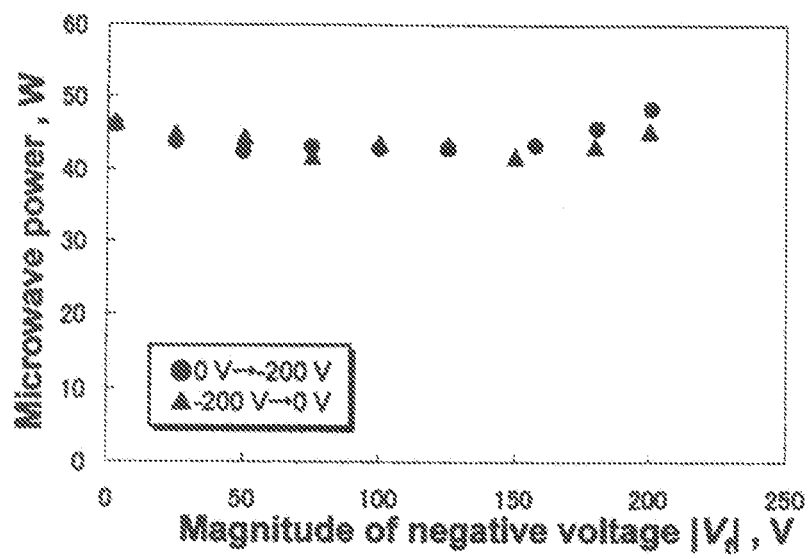
(b)

Fig. 23
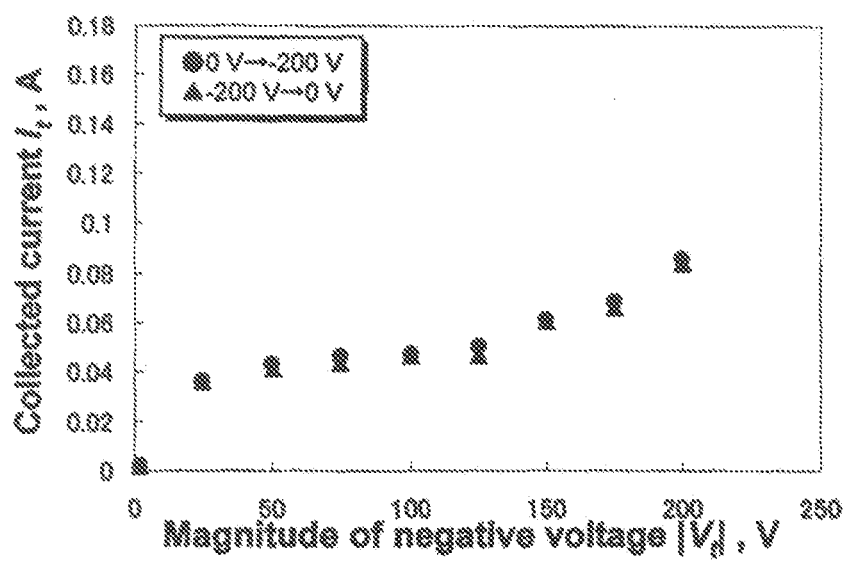
(a)
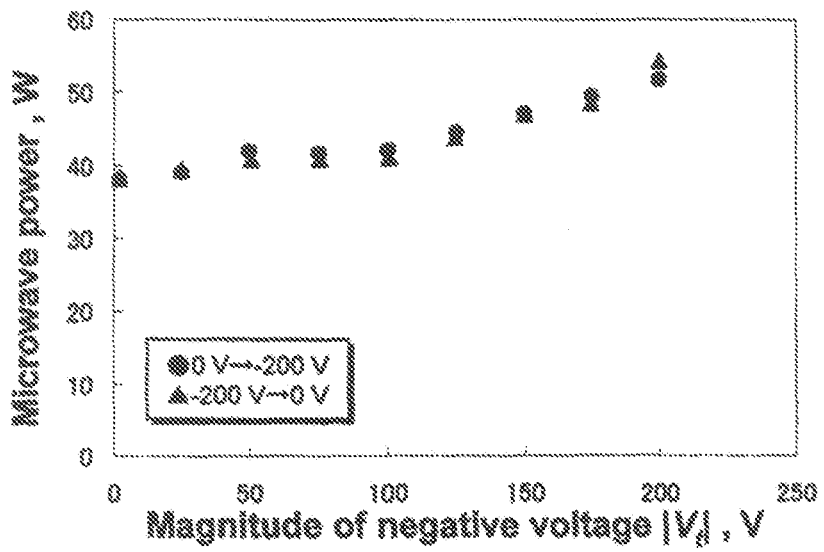
(b)

Fig. 24
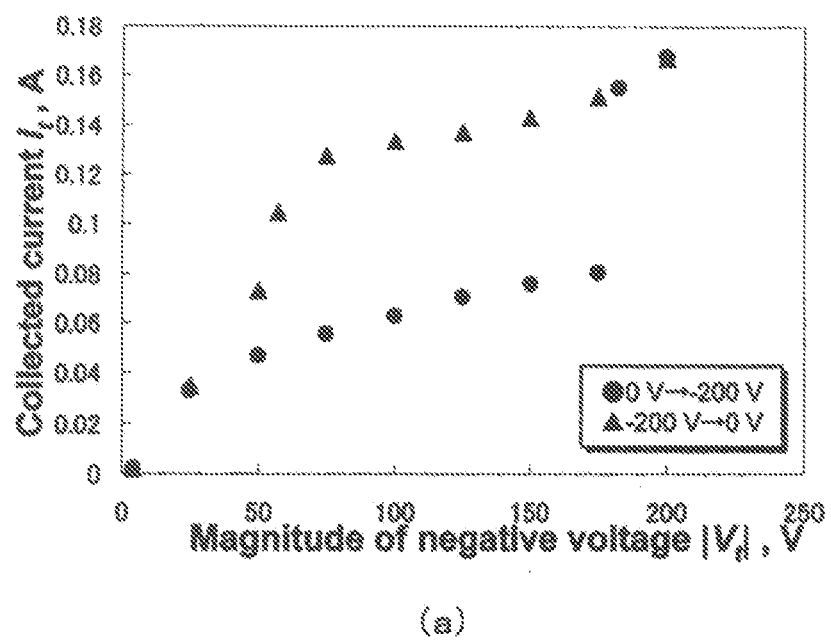
(a)
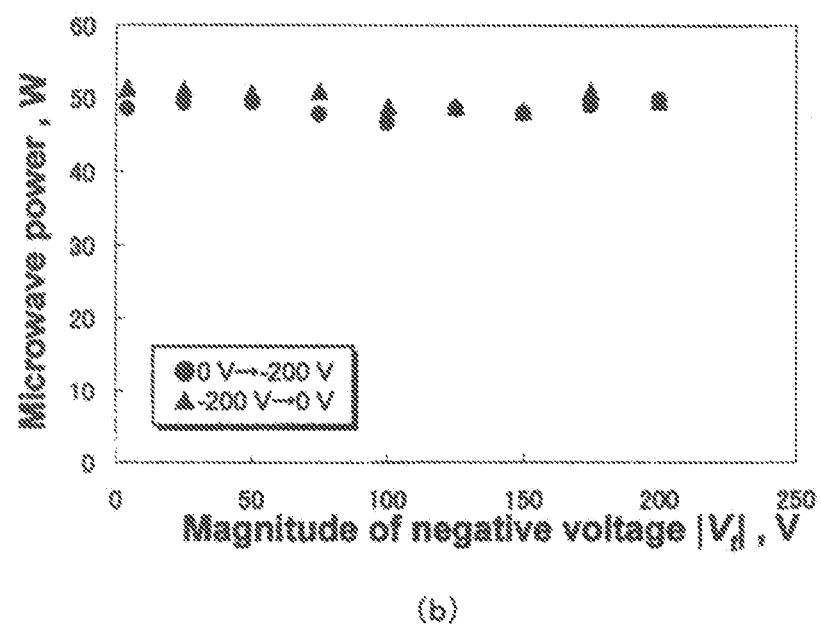
(b)

Fig. 25
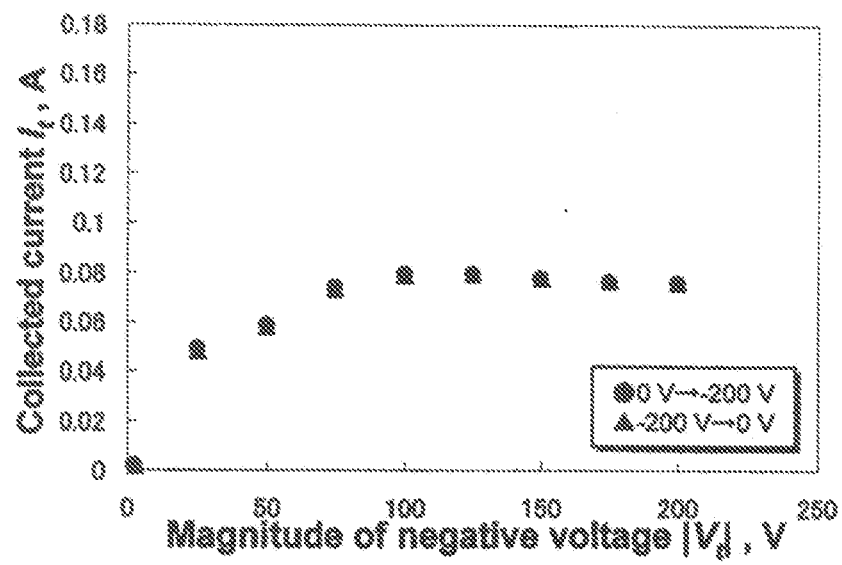
(a)
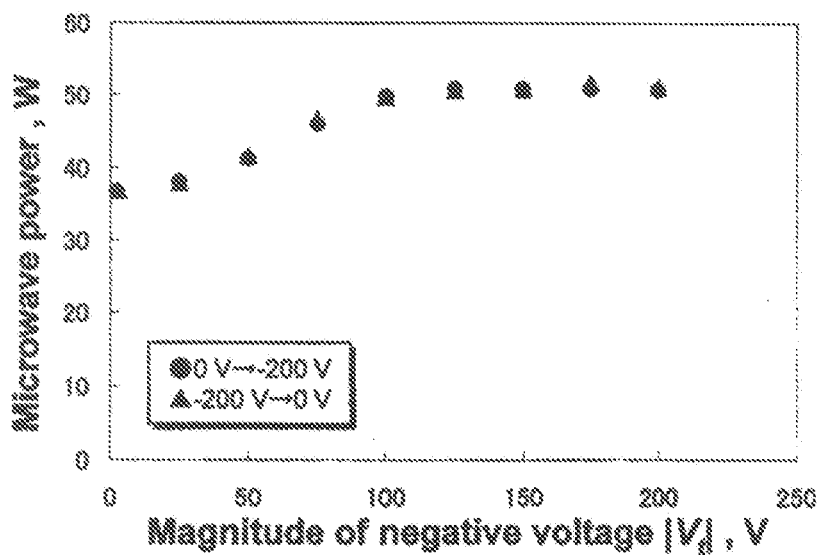
(b)

Fig. 26
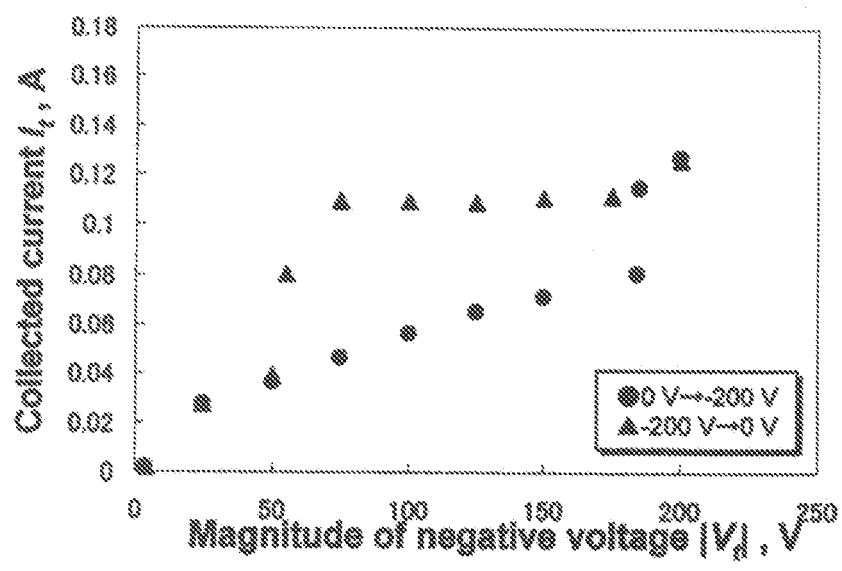
(a)
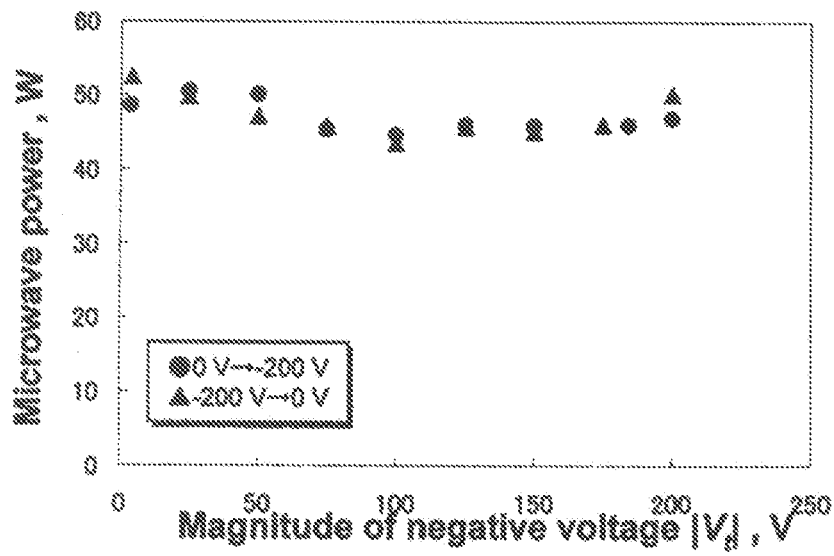
(b)

Fig. 27
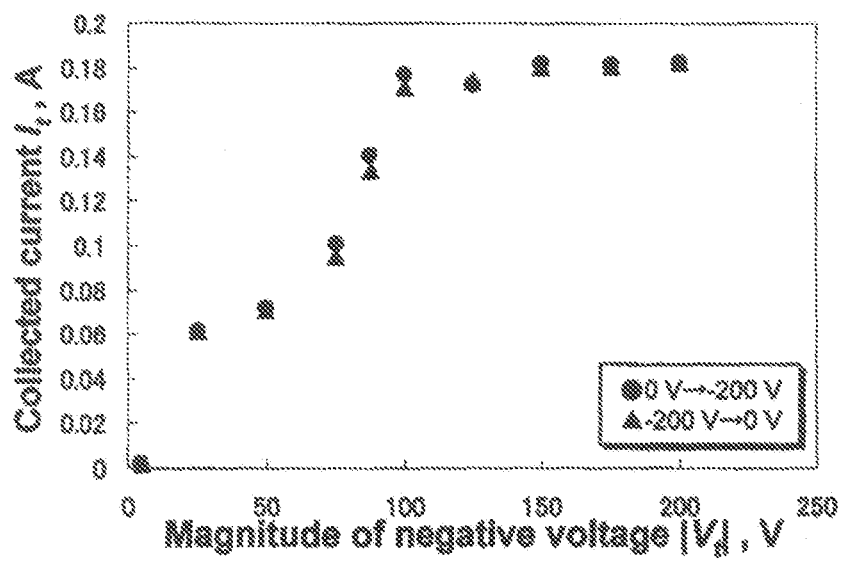
(a)
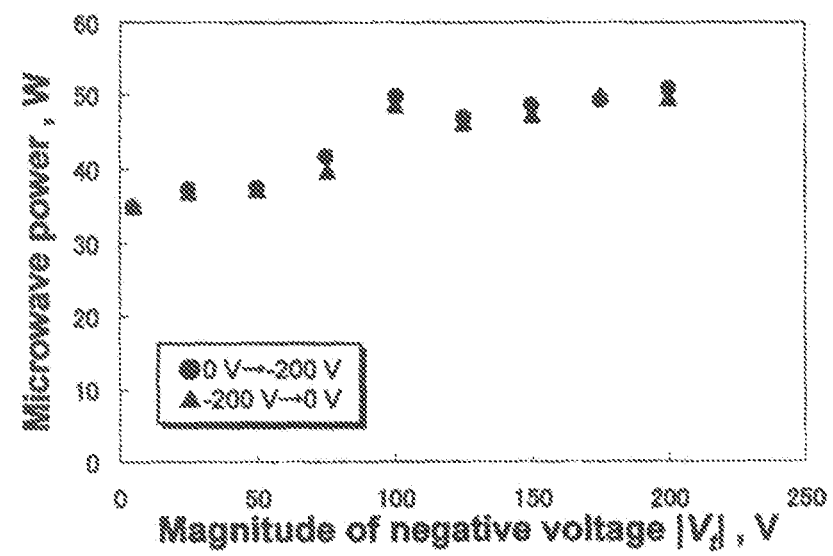
(b)

PLASMA PROCESSING DEVICE, PLASMA PROCESSING METHOD, AND PLASMA SURFACE PROCESSING METHOD

TECHNICAL FIELD

The present invention generally relates to a method and a device for performing thin-film coating and surface processing on a metal material or the like. More particularly, the present invention relates to a method and a device for generating plasma in the device to perform surface processing.

BACKGROUND ART

Conventionally, studies have been carried out on technologies of performing functional thin-film coating or surface processing on the inner surfaces of cylindrical parts such as a valve, a cylinder, a guide bush, a hole in a mold, an endoscope, and a nozzle to obtain corrosion resistance and sliding characteristics superior to those of a base material. A technology of performing surface processing or the like by using non-equilibrium plasma in order to achieve the above object is known in the art. SWP (Surface Wave-excited Plasma) and MVP (Microwave sheath Voltage combination Plasma) are examples of a plasma generation method. The SWP and the MVP have been developed since they have been expected as technologies that increase the plasma concentration and enable surface processing of the inner surface of a small bore of a pipe or the like.

There is a patent document shown below as a technology based on the above MVP. The MVP described in this patent document is plasma that is generated by a microwave introduced along the surface of a metal object when a negative bias voltage is applied to the metal object arranged near microwave introducing means in a chamber. The plasma thus generated distributes along an equipotential surface of the metal object. The microwave is thus propagated along the inner side surface of a pipe or the like, whereby the inner surface can be processed by the generated plasma.

[Patent document 1]
Japanese Patent Application Publication No. JP-A-2004-47207

DISCLOSURE OF THE INVENTION

Problems to be Solved by the Invention

The inventors of the present application have made further improvements on surface processing of the inner surface of a cylindrical part having a very small opening diameter (e.g., an inner diameter of 10 mm or less) by using the above MVP. However, as the opening diameter of a cylindrical part became smaller, it became more difficult to generate plasma inside the cylindrical part. This is because plasma is less likely to be generated when the inner diameter of a cylindrical part is smaller than the plasma sheath width. It is therefore necessary to reduce the plasma sheath width in order to generate plasma inside a cylindrical part. Based on the fact that the sheath width is inversely proportional to the one-half power of the plasma concentration, the inventors of the present application have keenly studied technologies for improving the plasma concentration. The inventors of the present application eventually found that, by improving the shapes and arrangement of members and the like around a cylindrical part, a microwave introduced into a chamber can be desirably introduced to the inside of the cylindrical part and high-concentration plasma can thus be generated inside the cylindrical part.

It is therefore an object of the present invention to improve the shapes of members around a member having a cylindrical portion to be processed, and consequently generate high concentration plasma inside the cylindrical portion to enable surface processing or the like of the inner surface of the member having a small opening diameter.

Means for Solving the Problems

The present invention is made to achieve the above object, and the invention according to claim 1 is structured as a plasma processing device including a chamber, microwave generating means for generating a microwave, microwave introducing means for introducing the microwave generated by the microwave generating means from outside of the chamber to inside of the chamber, and bias voltage applying means for applying a bias voltage to a member having a cylindrical portion to be processed which is provided in the chamber. The plasma processing device is characterized by further including microwave increasing means provided between the microwave introducing means and the member having a cylindrical portion to be processed, for introducing the microwave introduced into the chamber by the microwave introducing means into a cylinder of the member having a cylindrical portion to be processed, and increasing an amount of microwave that is absorbed by plasma in the cylinder. With this structure, since the amount of microwave that is absorbed by plasma in the cylinder of the member having a cylindrical portion to be processed is increased, plasma can be desirably generated within the cylinder.

The plasma processing device of the present invention performs surface treatment and functional coating of the inside of the cylinder. Of the microwave introduced into the chamber, the microwave increasing means introduces into the cylinder a microwave that has not been introduced into the cylinder of the member having a cylindrical portion to be processed. The microwave increasing means may introduce a microwave that is traveling through a material gas for plasma generation into the cylinder, or may introduce a microwave that is traveling inside the microwave introducing means into the cylinder.

The present invention may be structured as a plasma processing device characterized in that the member having a cylindrical portion to be processed has at least one open end, and the microwave increasing means introduces the microwave outside the open end of the member having a cylindrical portion to be processed into inside of the member having a cylindrical portion to be processed. In this structure, the amount of microwave that is absorbed by plasma inside the member having a cylindrical portion to be processed is increased by introducing the microwave outside the open end of the member having a cylindrical portion to be processed into the inside of the member having a cylindrical portion to be processed. Accordingly, plasma can be desirably generated inside the cylinder.

The present invention may be structured as a plasma processing device characterized in that the microwave increasing means is provided at the open end of the member having a cylindrical portion to be processed. In this structure, the open end of the member having a cylindrical portion to be processed is the position where the microwave is most likely to be introduced into the cylinder. Therefore, the amount of microwave that is absorbed by plasma within the cylinder can be increased by providing the microwave increasing means in this position.

The present invention may be structured as a plasma processing device characterized in that the microwave increasing means is an opening that is formed in a side surface of the member having a cylindrical portion to be processed, and the opening is covered by the microwave introducing means. In this structure, since the opening is covered by the microwave introducing means, the amount of microwave that is absorbed by plasma within the cylinder can be increased. Moreover, since the microwave increasing means is formed in the side surface of the member having a cylindrical portion to be processed, it is not necessary to provide a separate member. The structure of the plasma processing device can therefore be simplified.

The present invention may be structured as a plasma processing device characterized in that the microwave increasing means is an opening that is formed in a side surface of a cylindrical metal member holding at a predetermined position in the chamber the member having a cylindrical portion to be processed, and the opening is covered by the microwave introducing means. In this structure, the opening in the side surface of the cylindrical metal member is covered by the microwave introducing means. The amount of microwave that is absorbed by plasma within the cylinder can therefore be increased.

The present invention may be structured as a plasma processing device characterized in that the cylindrical metal member is open at both ends. In this structure, since the cylindrical metal member is open at both ends, the microwave can be desirably introduced into the member having a cylindrical portion to be processed. As a result, the amount of microwave that is absorbed by plasma inside the cylinder can be increased.

The present invention may be structured as a plasma processing device characterized in that the opening of the microwave increasing means is a slit that is opened to the microwave introducing means side. In this structure, the amount of microwave that is absorbed by plasma within the cylinder can be increased.

The present invention may be structured as a plasma processing device characterized in that the opening of the microwave increasing means is a hole of a predetermined shape. In this structure, the amount of microwave that is absorbed by plasma within the cylinder can be increased. Note that the hole of the predetermined shape in the microwave increasing means may have a predetermined shape such as a circular shape, a square shape, an elliptical shape, and a rectangular shape.

The present invention may be structured as a plasma processing device characterized in that the microwave increasing means is provided with at least two slits or holes. In this structure, since at least two slits or holes are provided, the amount of microwave that is absorbed by plasma within the cylinder can be increased.

The present invention may be structured as a plasma processing device characterized in that the at least two slits or holes are provided at opposing positions to each other. In this structure, since the at least two slits or holes are provided at opposing positions to each other, the microwave can be desirably introduced into the member having a cylindrical portion to be processed. Accordingly, the amount of microwave that is absorbed by plasma within the cylinder can be increased.

The present invention may be structured as a plasma processing device characterized in that the microwave introducing means is made of a dielectric material. In this structure, the dielectric material can increase the amount of microwave that is absorbed by plasma within the cylinder. Note that examples of the dielectric material include quartz, alumina, sapphire, and the like.

The present invention may be structured as a plasma processing device characterized in that the microwave introducing means is made of quartz. In this structure, the amount of microwave that is absorbed by plasma within the cylinder can be increased.

The present invention may be structured as a plasma processing device characterized by using one of argon plasma, nitrogen plasma, and hydrocarbon plasma.

The present invention may be structured as a plasma processing device characterized in that one of a $SiO_2$ film, a DLC film, and a nitride film is coated or formed on a surface of the member having a cylindrical portion to be processed.

The present invention may be structured as a plasma processing device characterized in that the member having a cylindrical portion to be processed is used in any of a gas pipe, a cylinder member, a valve member, and a hole in a mold.

The present invention is a plasma processing method for performing plasma processing by introducing a microwave into a chamber and applying a bias voltage to a member having a cylindrical portion to be processed which is provided in the chamber. The plasma processing method is characterized in that plasma processing is performed by providing, between microwave introducing means and the member having a cylindrical portion to be processed, a member for introducing the microwave within the chamber into a cylinder of the member having a cylindrical portion to be processed and increasing an amount of microwave that is absorbed by plasma in the cylinder. According to this method, the amount of microwave that is absorbed by plasma within the cylinder can be increased. As a result, plasma can be desirably generated inside the cylinder.

The present invention is a plasma surface processing method for performing surface processing in a cylinder of a member having a cylindrical portion to be processed. The plasma surface processing method is characterized in that, by the above plasma processing method, plasma is generated in the cylinder of the member having a cylindrical portion to be processed, whereby surface processing in the cylinder of the member having a cylindrical portion to be processed is performed. According to this method, surface processing in the cylinder of the member having a cylindrical portion to be processed can be desirably performed.

Effects of the Invention

In the present invention, the amount of microwave that is absorbed by plasma within the cylinder can be increased. As a result, plasma can be desirably generated inside the cylinder. Surface processing in the cylinder of the member having a cylindrical portion to be processed can therefore be desirably performed.

BEST MODES FOR CARRYING OUT THE INVENTION

Embodiments of the present invention will now be described in details. FIG. 1 is a cross-sectional view schematically showing an outline of a first embodiment to which the present invention is applied. Note that some parts are not shown in cross section in order to illustrate the relation between the parts.

A plasma processing device 2 is formed by a chamber 4 and a microwave generation device 6 for generating a microwave to be introduced in the chamber 4.

The chamber 4 includes an inlet port 8 so that plasma is desirably generated in the chamber 4. In the present embodiment, Ar is used as a discharge gas. The chamber 4 further includes an outlet port 10. The pressure in the chamber 4 is kept at a fixed value by a regulator device (not-shown) provided in the inlet port 8 and the outlet port 10. In each embodiment, the flow rate of the Ar gas is 5 sccm and the pressure thereof is 50 Pa.

The microwave generation device 6 is connected to the chamber 4 through a waveguide 12 and a microwave supplying portion 14. The microwave supplying portion 14 is provided so as to cover from outside a circular hole formed in a part of the chamber 4. A quartz tube 16 is fitted in the hole of the chamber 4. Note that, in each embodiment, the microwave power is 50 W.

The quartz tube 16 is made of quartz which is a dielectric material. The quartz tube 16 closes the hole of the chamber 4 so as to hermetically seal the chamber 4 from outside air. A microwave generated by the microwave generation device 6 goes through the waveguide 12 and the microwave supplying portion 14 and passes through the quartz tube 16 into the chamber 4.

The quartz tube 16 is formed by a columnar portion shaped so as to correspond to the circular hole of the chamber 4 and another columnar portion having an outer diameter larger than that of the other columnar portion. The larger-outer diameter columnar portion of the quartz tube 16 abuts on the outer wall of the chamber 4. The quartz tube 16 has a columnar void portion that is open to the inside of the chamber 4. A tube holder 18 is inserted into the void portion.

The tube holder 18 is a metal member having a columnar outer shape, and is fixed by a screw or the like (not shown) while inserted into the void portion of the quartz tube 16. The tube holder 18 can have various shapes as described below, but basically has a cylindrical shape having a columnar void portion inside.

A tube 20 having a small opening diameter is inserted and fixed in the tube holder 18 as a member to be processed. The small-opening-diameter tube 20 is a cylindrical metal member having an inner diameter of about several millimeters. Note that FIG. 1 does not show the quartz tube 16, the tube holder 18, and the small-opening-diameter tube 20 in cross section in order to show the relation between these parts. The relation between these parts alone is shown in FIG. 2.

The small-opening-diameter tube 20 is connected to a bias power supply 22 through a voltage introducing portion 23. The bias power supply 22 is supplied with power from a power supply outside the chamber 4, and applies a negative voltage to the small-opening-diameter tube 20. Note that an ammeter 24 is provided in series with the bias power supply 22 and a voltmeter 26 is provided in parallel with the bias power supply 22.

In the plasma processing device described above, in embodiments of the present invention and comparative examples, the quartz tube 16 and the tube holder 18 were produced in a plurality of shapes, and measurement was carried out for each combination of the parts. First, the shapes of the quartz tube 16 and the tube holder 18 will be described, and combinations of the parts will be described as embodiments and comparative examples.

FIG. 3(a) is an overall diagram of the quartz tube 16. FIG. 3(b) is a cross-sectional view of the quartz tube 16. The quartz tube 16 is formed by a large diameter portion 28 that is provided outside the chamber 4 and a small diameter portion 30 that is provided inside the chamber 4. A columnar void portion 32 is formed inside the small diameter portion 30.

FIG. 4(a) is an overall diagram of a quartz tube 34 and FIG. 4(b) is a cross-sectional view of the quartz tube 34. The quartz tube 34 is formed only by a large diameter portion, and a void portion 36 is formed inside the quartz tube 34.

FIG. 5(a) is an overall diagram of the tube holder 18 and FIG. 5(b) is a cross-sectional view of the tube holder 18 taken along a plane including an axis of the cylindrical shape of the tube holder 18. As shown in FIG. 5, two circular holes are formed in upper and lower portions of the side surface of the tube holder 18. The tube holder 18 is open at its both ends. Note that, in the following description of each tube holder, the left side in the figure is a quartz tube side, and the right side in the figure is a small-opening-diameter tube side.

FIG. 6(a) is an overall diagram of a tube holder 38 and FIG. 6(b) is a cross-sectional view of the tube holder 38 taken along a plane including an axis of the cylindrical shape of the tube holder 38. As shown in FIG. 6, one hole is formed in an upper portion of the side surface of the tube holder 38. The tube holder 38 is open at its both ends.

FIG. 7(a) is an overall diagram of a tube holder 40 and FIG. 7(b) is a cross-sectional view of the tube holder 40 taken along a plane including an axis of the cylindrical shape of the tube holder 40. As shown in FIG. 7, the tube holder 40 has no hole in the side surface thereof and has a simple cylindrical shape. Note that the tube holder 40 is open at its both ends.

FIG. 8(a) is an overall diagram of a tube holder 42 and FIG. 8(b) is a cross-sectional view taken along a plane including an axis of the cylindrical shape of the tube holder 42. As shown in FIG. 8, two circular holes are formed in upper and lower portions of the side surface of the tube holder 42. The tube holder 42 is not open at its left end in the figure and is open at its right end.

FIG. 9(a) is an overall diagram of a tube holder 44 and FIG. 9(b) is a cross-sectional view taken along a plane including an axis of the cylindrical shape of the tube holder 44. As shown in FIG. 9, one circular hole is formed in an upper portion of the side surface of the tube holder 44. The tube holder 44 is not open at its left end in the figure and is open at its right end.

FIG. 10(a) is an overall diagram of a tube holder 46 and FIG. 10(b) is a cross-sectional view taken along a plane including an axis of the cylindrical shape of the tube holder 46. As shown in FIG. 10, two slits are formed in upper and lower portions of the side surface of the tube holder 46. The slits extend from a position near the middle to the left end of the tube holder 46. The tube holder 46 is open at its both ends.

FIG. 11(a) is an overall diagram of a tube holder 48 and FIG. 11(b) is a cross-sectional view taken along a plane including an axis of the cylindrical shape of the tube holder 48. As shown in FIG. 11, one slit is formed in an upper portion of the side surface of the tube holder 48. The slit extends from a position near the middle to the left end of the tube holder 48. The tube holder 48 is open at its both ends.

The structure and the measurement result of each embodiment of the present invention and each comparative example will now be described. The embodiments are common in that the plasma processing device 2 of FIG. 1 is used, but are different from each other in the shape of the quartz tube or the tube holder. In each embodiment and each comparative example, a current value and a voltage value were measured by the ammeter 24 and the voltmeter 26 while varying the voltage of the bias power supply from 0 V to −200 V and then from −200 V to 0 V with time. Note that the small-openingdiameter tube 20 is made of stainless steel and has an inner diameter of 4.4 mm and a length of 50 mm.

First Embodiment

A first embodiment is structured by using the quartz tube 16 of FIG. 3 and the tube holder 18 of FIG. 5. The positional relation among the quartz tube 16, the tube holder 18, and the small-opening-diameter tube 20 is shown in FIG. 12. As shown in FIG. 12, the tube holder 18 is inserted into the quartz tube 16 and the outside of the holes formed in the side surface of the tube holder 18 is covered by the small diameter portion 30 of the quartz tube 16. The small-opening-diameter tube 20 is disposed inside the tube holder 18 to the right of the holes formed in the side surface of the tube holder 18 in the figure.

The measurement result of the first embodiment is shown in FIG. 13. FIG. 13(*a*) shows measurement of change in current value flowing in the small-opening-diameter tube 20 with respect to the bias voltage, and FIG. 13(*b*) shows measurement of change in microwave power with respect to the bias voltage. It can be seen from FIG. 13 that a larger current flows in the small-opening-diameter tube 20 when the bias voltage is varied from −200 V to 0 V compared to the case in which the bias voltage is varied from 0 V to −200 V. When a hysteresis is seen on the graph as in this case, dense plasma was visually observed inside the small-opening-diameter tube 20. Note that, in the first embodiment, plasma was generated inside the small-opening-diameter tube at −175 V in the process of reducing the bias voltage (the process of varying the bias voltage from 0 V to −200 V) and the plasma disappeared at −50 V in the process of increasing the bias voltage.

Accordingly, in the first embodiment of the present invention, plasma can be desirably generated inside the small-opening-diameter tube 20. Moreover, such dense plasma that causes a hysteresis on the graph is generated in the present embodiment. Plasma can therefore be desirably generated inside the small-opening-diameter tube 20 even when the tube 20 has a small opening diameter.

First Comparative Example

A first comparative example is given for comparison with the first embodiment. The first comparative example is structured by using the quartz tube 34 of FIG. 4 and the tube holder 18 of FIG. 5. The first comparative example is different from the first embodiment in the structure of the quartz tube. The positional relation among the quartz tube 34, the tube holder 18, and the small-opening-diameter tube 20 is shown in FIG. 14. The tube holder 18 is inserted in the quartz tube 34, but the holes in the side surface of the tube holder are not covered by the quartz tube 34.

The measurement result of the first comparative example is shown in FIG. 15. It can be seen from FIG. 15 that almost no hysteresis is seen on the graph even when the bias voltage is varied. Note that, in the first comparative example, plasma was generated at −175 V in the process of reducing the bias voltage, and the plasma disappeared at −175 V in the process of increasing the bias voltage.

Second Embodiment

A second embodiment is structured by using the quartz tube 16 of FIG. 3 and the tube holder 38 of FIG. 6. The positional relation among the quartz tube 16, the tube holder 38, and the small-opening-diameter tube 20 is not shown because it is the same as that shown in FIG. 12.

The measurement result of the second embodiment is shown in FIG. 16. Like the first embodiment, a hysteresis of the current value with respect to the bias voltage can be observed, but the difference in current value is smaller than that in the first embodiment. Note that, in the second embodiment, plasma appeared at −175 V in the process of reducing the bias voltage, and the plasma disappeared at −75 V in the process of increasing the bias voltage.

Second Comparative Example

A second comparative example is given for comparison with the second embodiment, and is structured by using the quartz tube 34 of FIG. 4 and the tube holder 38 of FIG. 6. The positional relation among the quartz tube 34, the tube holder 38, and the small-opening-diameter tube 20 is not shown because it is the same as that shown in FIG. 14.

The measurement result of the second comparative example is shown in FIG. 17. As shown in FIG. 17(*a*), unlike the second embodiment, no hysteresis of the current value with respect to the bias voltage is seen in the comparative example. Note that, in the second comparative example, plasma appeared at −175 V in the process of reducing the bias voltage, and the plasma disappeared at −175 V in the process of increasing the bias voltage.

Third Embodiment

A third embodiment is structured using the quartz tube 16 of FIG. 3 and the tube holder 42 of FIG. 8. The positional relation among the quartz tube 16, the tube holder 42, and the small-opening-diameter tube 20 is not shown because it is the same as that shown in FIG. 12.

The measurement result of the third embodiment is shown in FIG. 18. As shown in FIG. 18(*a*), a hysteresis of the current value with respect to the bias voltage can be observed. It can be considered that plasma is desirably generated inside the small-opening-diameter tube 20 in the third embodiment. Note that, in the third embodiment, plasma appeared at −160 V in the process of reducing the bias voltage, and the plasma disappeared at −60 V in the process of increasing the bias voltage.

Third Comparative Example

A third comparative example is given for comparison with the third embodiment, and is structured by using the quartz tube 34 of FIG. 4 and the tube holder 42 of FIG. 8. The positional relation among the quartz tube 34, the tube holder 42, and the small-opening-diameter tube 20 is not shown because it is the same as that shown in FIG. 14.

The measurement result of the third comparative example is shown in FIG. 19. As shown in FIG. 19(*a*), almost no hysteresis of the current value with respect to the bias voltage can be seen. Note that, in the third comparative example, plasma appeared at −175 V in the process of reducing the bias voltage, and the plasma disappeared at −175 V in the process of increasing the bias voltage.

Fourth Embodiment

A fourth embodiment is structured by using the quartz tube 16 of FIG. 3 and the tube holder 44 of FIG. 9. Note that the positional relation among the quartz tube 16, the tube holder 44, and the small-opening-diameter tube 20 is not shown because it is the same as that shown in FIG. 12.

The measurement result of the fourth embodiment is shown in FIG. 20. As shown in FIG. 20(a), a hysteresis of the current value with respect to the bias voltage can be observed, but the difference in current value is smaller than that in the third embodiment. Note that, in the fourth embodiment, plasma appeared at −160 V in the process of reducing the bias voltage, and the plasma disappeared at −60 V in the process of increasing the bias voltage.

Fourth Comparative Example

A fourth comparative example is given for comparison with the fourth embodiment and is structured by using the quartz tube 34 of FIG. 4 and the tube holder 44 of FIG. 9. Note that the positional relation among the quartz tube 34, the tube holder 44, and the small-opening-diameter tube 20 is not shown because it is the same as that shown in FIG. 14.

The measurement result of the fourth comparative example is shown in FIG. 21. As shown in FIG. 21(a), almost no hysteresis of the current value with respect to the bias voltage can be seen. Note that, in the fourth comparative example, no plasma was formed inside the small-opening-diameter tube 20.

Fifth Embodiment

A fifth embodiment is structured by using the quartz tube 16 of FIG. 3 and the tube holder 46 of FIG. 10. Note that the positional relation among the quartz tube 16, the tube holder 46, and the small-opening-diameter tube 20 is not shown because it is the same as that shown in FIG. 12.

The measurement result of the fifth embodiment is shown in FIG. 22. As shown in FIG. 22(a), a hysteresis of the current value with respect to the bias voltage can be observed. The difference in current value is larger than that in the first embodiment. Note that, in the fifth embodiment, plasma appeared at −175 V in the process of reducing the bias voltage, and the plasma disappeared at −50 V in the process of increasing the bias voltage.

Fifth Comparative Example

A fifth comparative example is given for comparison with the fifth embodiment and is structured by using the quartz tube 34 of FIG. 4 and the tube holder 46 of FIG. 10. Note that the positional relation among the quartz tube 34, the tube holder 46, and the small-opening-diameter tube 20 is not shown because it is the same as that shown in FIG. 14.

The measurement result of the fifth comparative example is shown in FIG. 23. As shown in FIG. 23(a), almost no hysteresis of the current value with respect to the bias voltage can be observed. Note that, in the fifth comparative example, no plasma was formed inside the small-opening-diameter tube 20.

Sixth Embodiment

A sixth embodiment is structured by using the quartz tube 16 of FIG. 3 and the tube holder 48 of FIG. 11. The positional relation among the quartz tube 16, the tube holder 48, and the small-opening-diameter tube 20 is not shown because it is the same as that shown in FIG. 12.

The measurement result of the sixth embodiment is shown in FIG. 24. As shown in FIG. 24(a), a hysteresis of the current value with respect to the bias voltage can be observed on the graph. The difference in current value is smaller than that in the fifth embodiment. Note that, in the sixth embodiment, plasma appeared at −175 V in the process of reducing the bias voltage, and the plasma disappeared at −50 V in the process of increasing the bias voltage.

Sixth Comparative Example

A sixth comparative example is given for comparison with the sixth embodiment and is structured by using the quartz tube 34 of FIG. 4 and the tube holder 48 of FIG. 11. Note that the positional relation among the quartz tube 34, the tube holder 48, and the small-opening-diameter tube 20 is not shown because it is the same as that shown in FIG. 14.

The measurement result of the sixth comparative example is shown in FIG. 25. As shown in FIG. 25(a), almost no hysteresis of the current value with respect to the bias voltage can be observed on the graph. Note that, in the sixth comparative example, plasma appeared at −100 V in the process of reducing the bias voltage, and the plasma disappeared at −100 V in the process of increasing the bias voltage.

Seventh Comparative Example

A seventh comparative example is given for comparison with the first embodiment and is different from the first embodiment in the shape of the tube holder. The seventh comparative example is structured by using the quartz tube 16 of FIG. 3 and the tube holder 40 of FIG. 7. The positional relation among the quartz tube 16, the tube holder 40, and the small-opening-diameter tube 20 is not shown because it is the same as that shown in FIG. 12.

The measurement result of the seventh comparative example is shown in FIG. 26. As shown in FIG. 26(a), almost no hysteresis of the current value with respect to the bias voltage can be observed. Note that, in the seventh comparative example, plasma appeared at −175 V in the process of reducing the bias voltage, and the plasma disappeared at −175 V in the process of increasing the bias voltage.

Eighth Comparative Example

An eighth comparative example is structured by using the quartz tube 34 of FIG. 4 and the tube holder 40 of FIG. 7. The positional relation among the quartz tube 34, the tube holder 40, and the small-opening-diameter tube 20 is not shown because it is the same as that shown in FIG. 14.

The measurement result of the eighth comparative example is shown in FIG. 27. As shown in FIG. 27(a), almost no hysteresis of the current value with respect to the bias voltage can be observed. Note that, in the eighth comparative example, no plasma was formed inside the small-opening-diameter tube 20.

The first through sixth embodiments and the first through eights comparative examples have been described above. Hereinafter, the shapes of the quartz tube and the tube holder will be considered.

(Shape of the Quartz Tube)

In the first through sixth embodiments, measurement was carried out by using the quartz tube 16 of FIG. 3. In the first through sixth comparative examples, measurement was carried out by using the quartz tube 34 of FIG. 4. As can be seen from the comparison between FIGS. 13(a) and 15(a) showing the measurement results of the first embodiment and the first comparative example, the first embodiment and the first comparative example are different from each other in whether or not there is a hysteresis of the current value with respect to the bias voltage. This difference can be observed between the second embodiment and the second comparative example and between the fourth embodiment and the fourth comparative example. Based on these facts, it can be considered that a microwave transmits through the inside of the small diameter portion 30 of the quartz tube 16 and the amount of microwave that is absorbed by plasma in the cylinder of the small-opening-diameter tube 20 increases, whereby dense plasma is generated inside the small-opening-diameter tube 20. Note that the quartz tube 16 includes the small diameter portion 30 and the large diameter portion 28 in each embodiment of the present invention. However, the present invention is not limited to this, and the quartz tube 16 may have other shapes as long as the quartz tube 16 covers the hole(s) or slit(s) of the tube holder from outside. For example, the small diameter portion 30 of the quartz tube 16 of FIG. 3 may be formed with the diameter of the large diameter portion 28.

(Presence/Absence of Holes in the Tube Holder)

The tube holder 18 of the first embodiment has two holes in its side surface, while the tube holder 40 of the seventh comparative example has no hole in its side surface. As can be seen from the comparison between FIGS. 13(a) and 26(a) showing the measurement results of the first embodiment and the seventh comparative example, a hysteresis can be observed in the first embodiment, while almost no hysteresis can be observed in the seventh comparative example. It can therefore be considered that a microwave passes through the small diameter portion 30 of the quartz tube 16 and enters the inside of the small-opening-diameter tube 20 through the holes of the tube holder.

(Number of Holes in the Tube Holder)

The tube holder 18 of the first embodiment has two holes in its side surface, while the tube holder 38 of the second embodiment has one hole in its side surface. As can be seen from the comparison between FIGS. 13(a) and 16(a) showing the measurement results of the two embodiments, the hysteresis width (difference in current value) of the first embodiment is larger than that of the second embodiment. Therefore, the tube holder having two holes in its side surface enables plasma to be more desirably generated in the small-opening-diameter tube 20 than the tube holder having one hole in its side surface.

(Hole Shape of the Tube Holder)

The tube holder 18 of the first embodiment has circular holes, while the tube holder 46 of the fifth embodiment has slits opening to the end. As can be seen from the comparison between FIG. 13(a) and FIG. 22(a) showing the measurement results of the two embodiments, the hysteresis width of the fifth embodiment is larger than that of the first embodiment. Plasma can therefore be more desirably generated inside the small-opening-diameter tube when the opening area of the side surface of the tube holder is increased.

Note that the opening area of the side surface of the tube holder was maximized, that is, the sidewall of the tube holder was completely removed, and the same measurement was carried out. In this case, it was difficult to generate plasma inside the small-opening-diameter tube 20. It can therefore be considered that an opening such as a hole or a slit needs to be formed in the side surface of the tube holder, but at the same time, it is also important that the tube holder has a side surface portion.

(Presence/Absence of the Bottom of the Tube Holder)

The tube holder 18 of the first embodiment is open at the bottom of the quartz tube 16 side (left side in FIG. 5), while the tube holder 42 of the fourth embodiment is closed at the bottom of the quartz tube 16 side. As can be seen from the comparison between FIGS. 13(a) and 18(a) showing the measurement results of the two embodiments, there is almost no difference between both graphs. It can therefore be considered that the shape of the bottom of the tube holder hardly affects generation of plasma in the small-opening-diameter tube 20.

The above description can be summarized as follows: in order to desirably introduce a microwave generated by the microwave generation device 6 into the small-opening-diameter tube 20 and generate plasma inside the small-opening-diameter tube 20 in the plasma processing device 2, it is important to design the shape of the quartz tube and the tube holder in consideration of the following matters.

Regarding the shape of the quartz tube, it is important to provide the small diameter portion 30 so as to cover the tube holder from outside. This is important in order to effectively introduce a microwave from the microwave supplying portion 14 into the inside of the tube holder and further into the inside of the small-opening-diameter tube 20.

It is also important to form an opening in the side surface of the tube holder. This is important in order to introduce a microwave introduced into the small diameter portion 30 of the quartz tube 16 into the inside of the tube holder through the opening and further into the inside of the small-opening-diameter tube 20. Examples of the opening that is formed in the side surface of the tube holder include a hole and a slit. As described above, however, it is difficult to generate plasma inside the small-opening-diameter tube 20 if the opening size is too large. It is therefore desirable to leave at least a part of the side surface of the tube holder.

It is important to appropriately change the number and size of holes or slits formed in the side surface of the tube holder. When the small-opening-diameter tube 20 has a small inner diameter, the hole or slit size needs to be determined relatively strictly.

The tube holder may be either open or closed at the bottom of the quartz tube side. In view of easiness of production of the tube holder, it is desirable that the tube holder is open at the bottom of the quartz tube side.

Accordingly, in the present invention, the quartz tube 16 and each tube holder described above can be used in order to introduce a microwave into the inside of the small-opening-diameter tube 20 and increase the microwave inside the small-opening-diameter tube 20. With the combination of the quartz tube 16 and each tube holder, plasma is generated inside the small-opening-diameter tube 20. The use of both the quartz tube 16 and each tube holder therefore enables plasma to be generated inside the small-opening-diameter tube 20.

When the small-opening-diameter tube 20 has a small inner diameter, plasma is less likely to be generated inside the small-opening-diameter tube 20. In this case, it is therefore desirable to efficiently introduce a microwave into the inside of the small-opening-diameter tube 20. For example, the tube holder 18 or the tube holder 46 can be used as in the first and fifth embodiments.

Hereinafter, the measurement results of the plasma processing devices 2 of the first embodiment, the seventh comparative example, and the fifth embodiment will be described. In this measurement, the output power of the microwave generation device was reduced with the bias voltage retained at −200 V.

FIG. 28 shows the measurement result of the plasma processing device 2 of the first embodiment. As shown in FIG. 28, the current value decreases as the output power of the microwave generation device 6 is reduced from 50 W. Plasma in the small-opening-diameter tube 20 disappeared when the microwave power was reduced to about 20 W.

FIG. 29 shows the measurement result of the plasma processing device 2 of the seventh comparative example. As shown in FIG. 29, the current value decreases as the microwave power is reduced. Plasma inside the small-opening-diameter tube 20 disappeared when the microwave power is reduced to about 30 W.

FIG. 30 shows the measurement result of the plasma processing device of the fifth embodiment. As shown in FIG. 30, as the microwave power was reduced, plasma inside the small-opening-diameter tube 20 disappeared when the microwave power was reduced to about 15 W.

FIG. 31 shows a graph comparing the magnitude of the microwave power when plasma disappeared in the above three measurement results. It can be seen from FIG. 31 that plasma can be maintained even with low microwave power by using the tube holder 46 of the fifth embodiment. It can therefore be considered that the tube holder 46 can increase the most the amount of microwave absorbed by plasma within the cylinder. The measurement result of FIG. 30 excellently matches the measurement result of FIG. 24(*a*) showing a large hysteresis. In other words, in the case where the hysteresis width of the current value with respect to the bias voltage (the difference in current value) is large, the amount of microwave that is absorbed by plasma within the cylinder can be increased, whereby plasma can be generated inside the small-opening-diameter tube 20.

(Observation Result of the Inner Surface of the Small-Opening-Diameter Tube and Consideration)

Hereinafter, the observation result of the inner surface of the small-opening-diameter tube 20 in the plasma processing device 2 of the present invention will be shown and considered. In this observation, plasma was generated inside the small-opening-diameter tube 20 and the inner surface of the small-opening-diameter tube 20 was processed by the plasma. In this experiment, a Ti pipe (outer diameter: 6 mm; inner diameter: 4 mm; and length: 75 mm) was used as the small-opening-diameter tube 20. The nitriding conditions of the plasma processing device 2 were as follows: microwave power: 40 W; gas pressure: 68 Pa; Ar flow rate: 40 sccm; and nitrogen flow rate: 30 sccm. The tube holder 18 of FIG. 5 having two holes in the side surface and the tube holder 40 of FIG. 7 having no hole in the side surface were used in this experiment to observe the difference in surface processing of the inside of the small-opening-diameter tube 20 depending on presence/absence of the holes.

Images of the inner surface of the small-opening-diameter tube 20 are shown in FIG. 32. FIG. 32 shows the small-opening-diameter tube 20 cut along a direction parallel to the axis. FIG. 32 therefore shows the inner surface of the small-opening-diameter tube 20. The upper two images of FIG. 32 show the inner surface of the small-opening-diameter tube 20 plasma-processed by using the tube holder 18, and the lower two images of FIG. 32 show the inner surface of the small-opening-diameter tube 20 plasma-processed by using the tube holder 40. Note that, in FIG. 32, the left side in the figure is the tube holder side of the small-opening-diameter tube 20 (the bottom side; the lower side of FIG. 1) and the right side in the figure is the tip side of the small-opening-diameter tube 20.

As a comparative example, FIG. 33 shows images of the inner surface of the small-opening-diameter tube 20 which has not been subjected to plasma surface processing. As can be seen from the comparison between FIGS. 32 and 33, the inner surface of the small-opening-diameter tube 20 of FIG. 32 changed in color as compared to the inner surface of the small-opening-diameter tube 20 of FIG. 33, and a nitride film was formed on the inner surface of the small-opening-diameter tube 20 of FIG. 32 by plasma. When the upper two small-opening-diameter tubes 20 of FIG. 32 are compared with the lower two small-opening-diameter tubes 20 in FIG. 32, the colors of the inner surfaces of the upper two small-opening-diameter tubes 20 are relatively uniform from left to right in the figure, while the colors of the inner surfaces of the lower two small-opening-diameter tubes 20 vary toward the right. In the actual images, the upper two small-opening-diameter tubes 20 have a relatively uniform golden color from left to right, while the lower two small-opening-diameter tubes 20 discolored toward the right to a color like purple and blue mixed to a golden color. This is considered to be because a compound other than TiN was formed on the inner surface of the small-opening-diameter tube 20.

Images of the inner surface of the small-opening-diameter tube 20 observed and taken by a microscope are shown in FIG. 34. The three images on the left side of FIG. 34 are images of the inner side of the small-opening-diameter tube 20 using the tube holder 18, and the three images on the right side of FIG. 34 are images of the inner side of the small-opening-diameter tube 20 using the tube holder 40. The images of FIG. 34 are images of portions near the bottom, middle, and tip of the small-opening-diameter tube 20. According to FIG. 34, it was observed that, in the upper right image, that is, in the case where plasma surface processing was performed by using the tube holder 40, the inner surface of the small-opening-diameter tube 20 discolored to a color mixed with purple as compared to the upper left image.

It can be considered from the observation result of FIGS. 32 and 34 that, when the tube holder 18 was used, a nitride film was able to be desirably formed on the inner surface of the small-opening-diameter tube 20 as compared to the case where the tube holder 40 was used. It can therefore be considered that a microwave was introduced into the inside of the small-opening-diameter tube 20 through the holes formed in the tube holder 18 and thus plasma was desirably generated inside the small-opening-diameter tube 20.

The present invention is not limited to the above embodiments, and various modifications thereof are possible. For example, means for introducing a microwave from both end sides of a small-opening-diameter tube (a member having a cylindrical portion to be processed) may be used and a ground electrode may be inserted into the small-opening-diameter tube in order to stabilize plasma generation. By using the plasma processing device and the plasma processing method of the present invention (e.g., argon plasma, nitrogen plasma, hydrocarbon plasma, or the like), surface processing can be performed to the inside of the member having a cylindrical portion to be processed. Examples of the member having a cylindrical portion to be processed include a valve member (e.g., an automobile fuel injector valve and valves for use in other applications), a nozzle member (e.g., a recording head nozzle and nozzles for use in other applications), a cylinder member (e.g., an engine cylinder and cylinders for use in other applications), a guide bush member (e.g., a guide bush used for a chuck part of a tool and guide bushes for use in other applications), a hole in a mold (e.g., a hole formed in a core of a mold for injection molding, and a hole in a mold for use in other parts), a gas pipe (e.g., a gas introducing pipe for a plasma process, a gas introducing pipe to a CVD chamber, and a pipe of other parts), and a part for a medical device (e.g., a pipe-like part for an endoscope, and other medical parts).

Performing surface processing to the inside of the member having a cylindrical portion to be processed enables formation of an abrasion-resistant thin film (an abrasion-resistant DLC film: an abrasion-resistant diamond-like carbon film), formation of an insulating thin film, production of a corrosion-resistant coating, and production of an insulating coating. Note that films other than DLC, a nitride film, and the like may be formed.

For example, in the case where a member having a cylindrical portion to be processed is used for a gas pipe or a valve, the pipe or the valve is made of stainless steel in order to prevent the inner surface of a flow path, that is, the inner surface of the member having a cylindrical portion to be processed, from being corroded by a corrosive gas. Plasma surface processing technology of forming a $SiO_2$ or DLC thin film on the inner surface of a pipe has been demanded in order to further improve the corrosion resistance of the pipe and the like. As the inner diameter of the pipe becomes smaller, however, it becomes difficult to cause plasma to be present inside the pipe by the conventional plasma processing, thereby making the surface processing of the pipe difficult. The plasma processing device and the plasma processing method of the present invention, on the other hand, have a high plasma density and therefore enable plasma to be present inside the pipe and enable surface processing of the pipe.

In the case where the member having a cylindrical portion to be processed is used for a long metal pipe as a machine element part having an electrical cord or the like arranged on the inner side thereof, surface processing technology of forming a $SiO_2$ or DLC thin film on the inner surface of the metal pipe has been demanded in order to prevent electric leakage from the inner surface to the outer surface of the metal pipe. As the inner diameter of the pipe becomes smaller, however, it becomes difficult to cause plasma to be present inside the pipe by the conventional plasma processing, thereby making the surface processing of the inner surface of the pipe difficult. The plasma processing device and the plasma processing method of the present invention, on the other hand, have a high plasma density and therefore enable plasma to be present inside the pipe and enable surface processing of the inner surface of the pipe.

In the case where the member having a cylindrical portion to be processed is used as a part of a mold for injection-molding a resin part, it is desirable that the friction between the inner surface of the mold and the molded part is low and the mold separation property therebetween is good. Accordingly, technology of forming DLC or the like on the inner surface of the mold by plasma processing has been demanded. As the inner diameter of the mold becomes smaller, however, it becomes difficult to cause plasma to be present inside the mold by the conventional plasma processing, thereby making the surface processing of the inner surface of the mold difficult. The plasma processing device and the plasma processing method of the present invention, on the other hand, have a high plasma density and therefore enable plasma to be present inside the mold and enable surface processing of the inner surface of the mold.

In the case where the member having a cylindrical portion to be processed is used for an inner-surface sliding portion of a nozzle member, a cylinder member, a guide bush member, a hole in a mold (e.g., a sliding portion with a slide core) or the like, it is desirable that the surface of each member listed above is a low friction surface with respect to the other member. Accordingly, technology of forming a low friction coating film such as DLC on the friction surface of each member listed above by plasma processing has been demanded. As the inner diameter of each member listed above becomes smaller, however, it becomes difficult to cause plasma to be present on the inner surface of the member, thereby making the surface processing of the inner surface difficult. The plasma processing device and the plasma processing method of the present invention, on the other hand, have a high plasma density and therefore enable plasma to be present on the inner surface having a small inner diameter and enable surface processing of the inner surface.

The above surface processing improves abrasion resistance and insulating property of the member having a cylindrical portion to be processed, and also enables reduction in product cost and reduction in product size. Moreover, the cylindrical member having a surface-processed inner surface can be used in products in which the use of such cylindrical member has been difficult. As a result, an extremely great value can be created in the industry.

BRIEF DESCRIPTION OF THE DRAWINGS

FIG. 3 shows diagrams for illustrating a quartz tube 16 of an embodiment of the present invention.

FIG. 4 shows diagrams for illustrating a quartz tube 34 of a comparative example of the present invention.

FIG. 5 shows diagrams for illustrating a tube holder 18 of an embodiment of the present invention.

FIG. 6 shows diagrams for illustrating a tube holder 38 of an embodiment of the present invention.

FIG. 7 shows diagrams for illustrating a tube holder 40 of a comparative example of the present invention.

FIG. 8 shows diagrams for illustrating a tube holder 42 of an embodiment of the present invention.

FIG. 9 shows diagrams for illustrating a tube holder 44 of an embodiment of the present invention.

FIG. 10 shows diagrams for illustrating a tube holder 46 of an embodiment of the present invention.

FIG. 11 shows diagrams for illustrating a tube holder 48 of an embodiment of the present invention.

FIG. 13 shows diagrams for illustrating the measurement result of a first embodiment of the present invention.

FIG. 15 shows diagrams for illustrating the measurement result of a first comparative example of the present invention.

FIG. 16 shows diagrams for illustrating the measurement result of a second embodiment of the present invention.

FIG. 17 shows diagrams for illustrating the measurement result of a second comparative example of the present invention.

FIG. 18 shows diagrams for illustrating the measurement result of a third embodiment of the present invention.

FIG. 19 shows diagrams for illustrating the measurement result of a third comparative example of the present invention.

FIG. 20 shows diagrams for illustrating the measurement result of a fourth embodiment of the present invention.

FIG. 21 shows diagrams for illustrating the measurement result of a fourth comparative example of the present invention.

FIG. 22 shows diagrams for illustrating the measurement result of a fifth embodiment of the present invention.

FIG. 23 shows diagrams for illustrating the measurement result of a fifth comparative example of the present invention.

FIG. 24 shows diagrams for illustrating the measurement result of a sixth embodiment of the present invention.

FIG. 25 shows diagrams for illustrating the measurement result of a sixth comparative example of the present invention.

FIG. 26 shows diagrams for illustrating the measurement result of a seventh comparative example of the present invention.

FIG. 27 shows diagrams for illustrating the measurement result of an eighth comparative example of the present invention.

Figure 1:
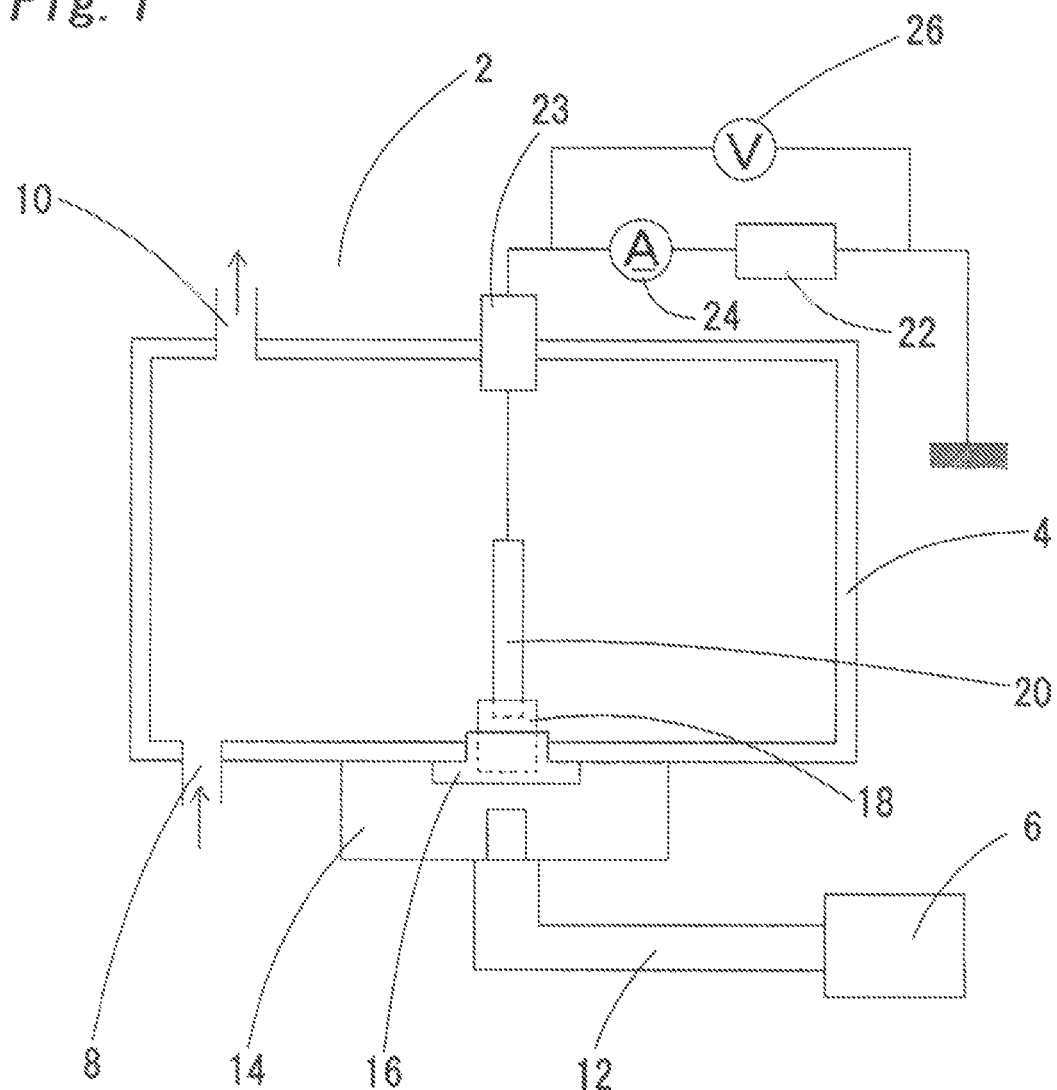
FIG. 1 is a schematic overall diagram of an embodiment of the present invention.
Figure 2:
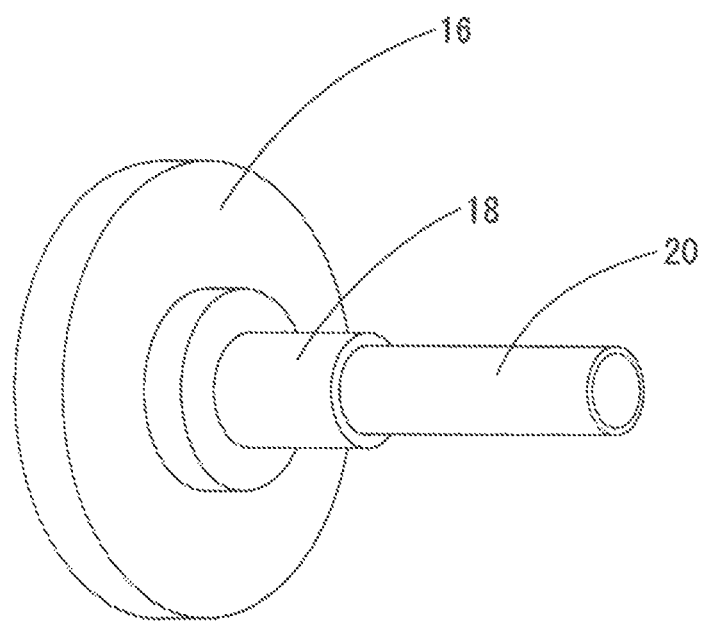
FIG. 2 is a diagram for illustrating the positional relation of each member of an embodiment of the present invention.
Figure 12:
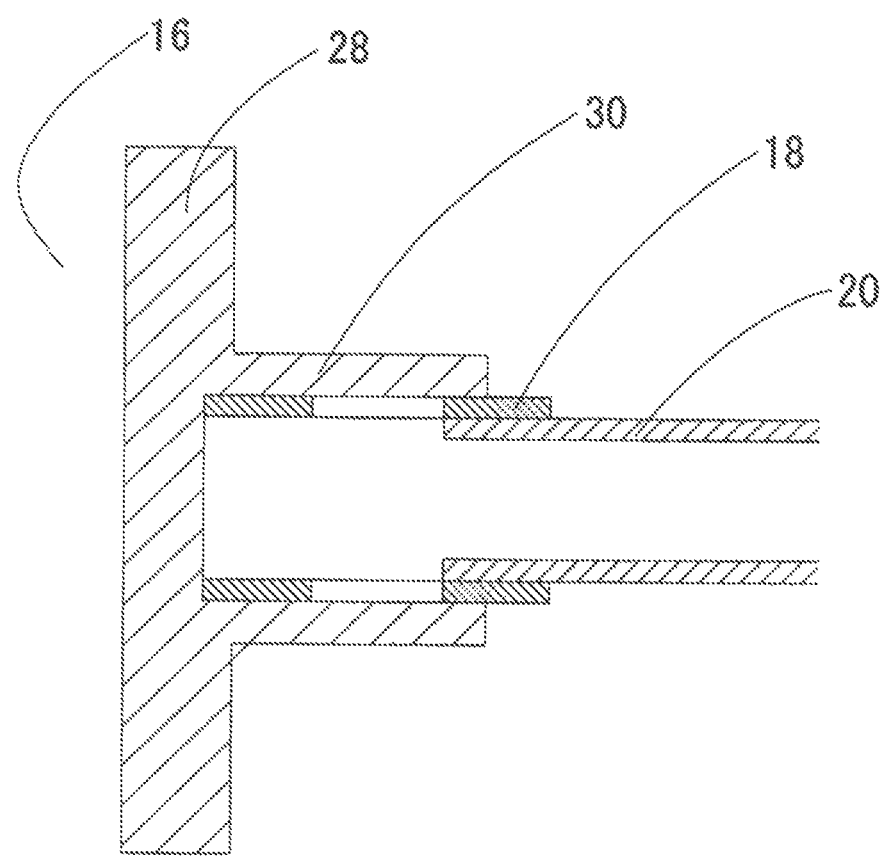
FIG. 12 is a diagram for illustrating the positional relation of each member of an embodiment of the present invention.
Figure 14:
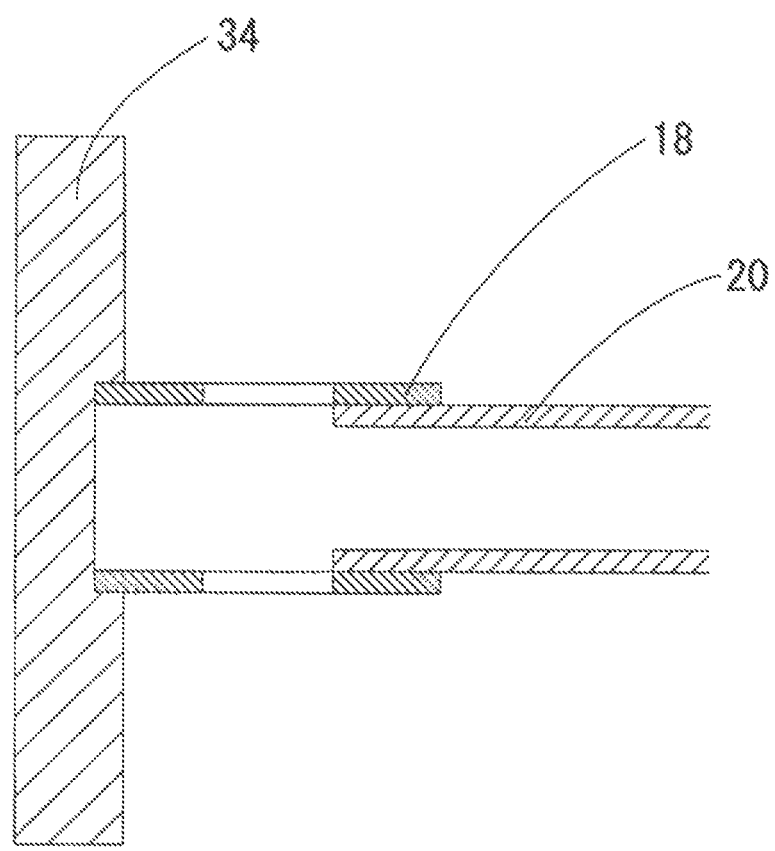
FIG. 14 is a diagram for illustrating the positional relation of each member of an embodiment of the present invention.
Figure 28:
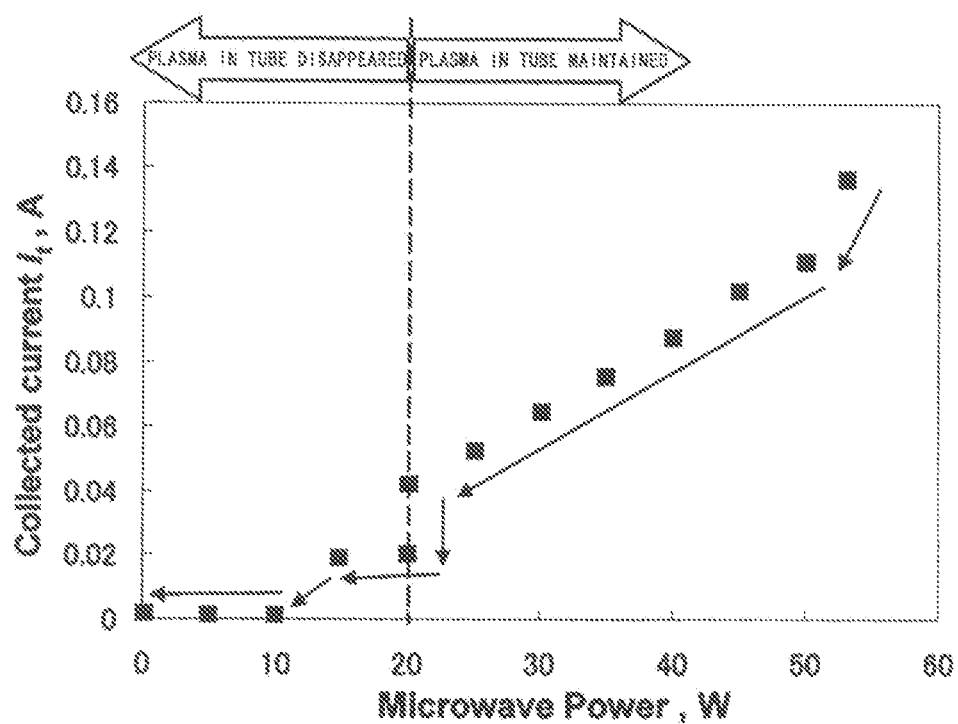
FIG. 28 is a diagram for illustrating the measurement result of the first embodiment of the present invention.
Figure 29:
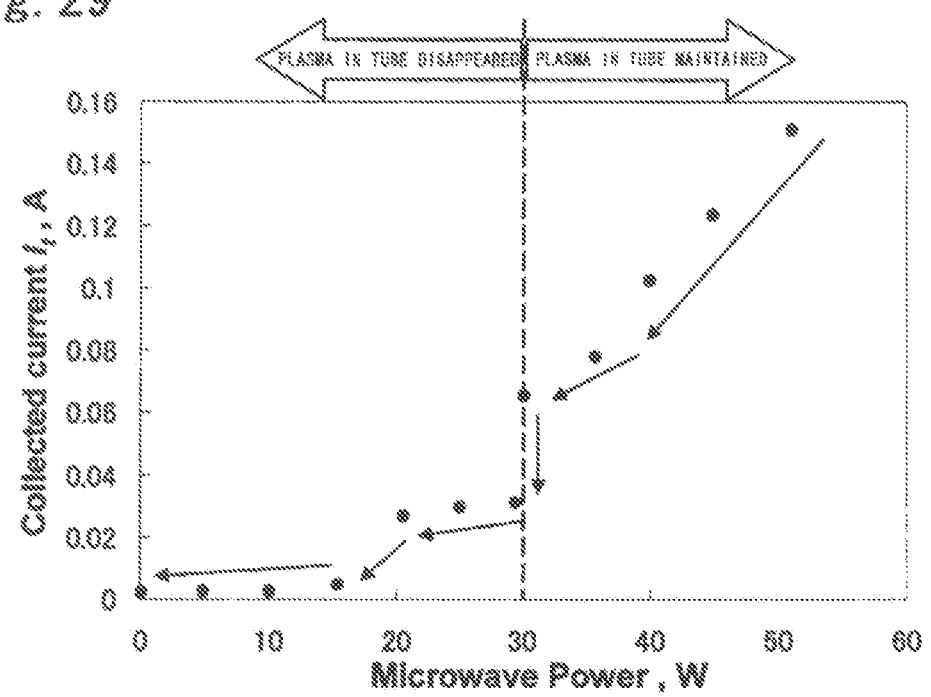
FIG. 29 is a diagram for illustrating the measurement result of the seventh comparative example of the present invention.
Figure 30:
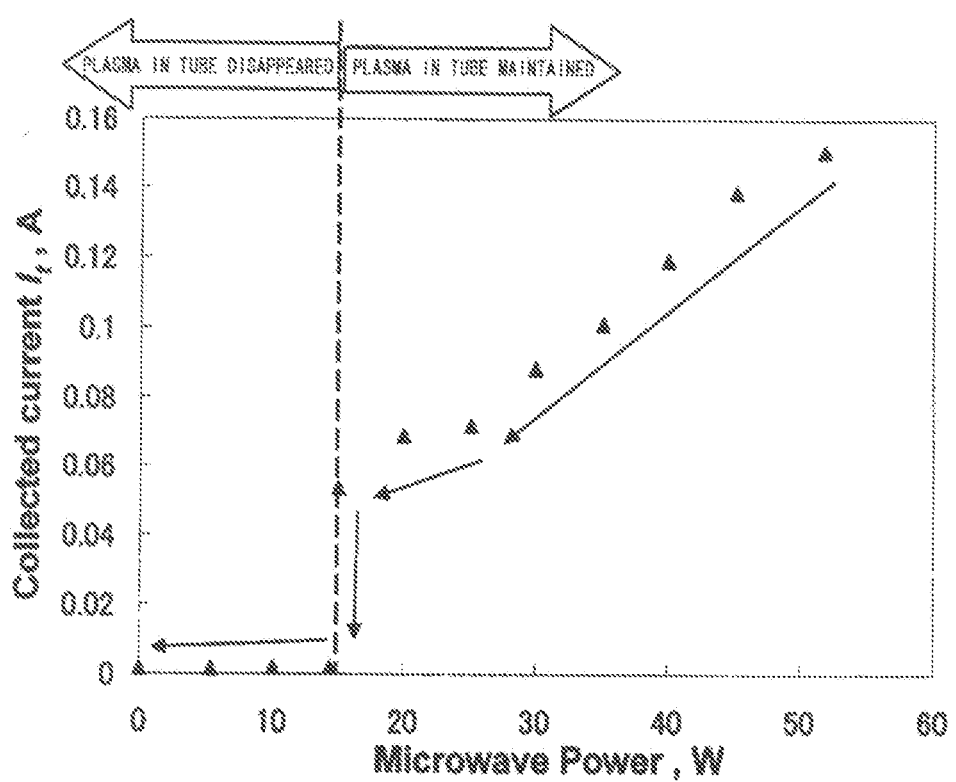
FIG. 30 is a diagram for illustrating the measurement result of the fifth embodiment of the present invention.
Figure 31:
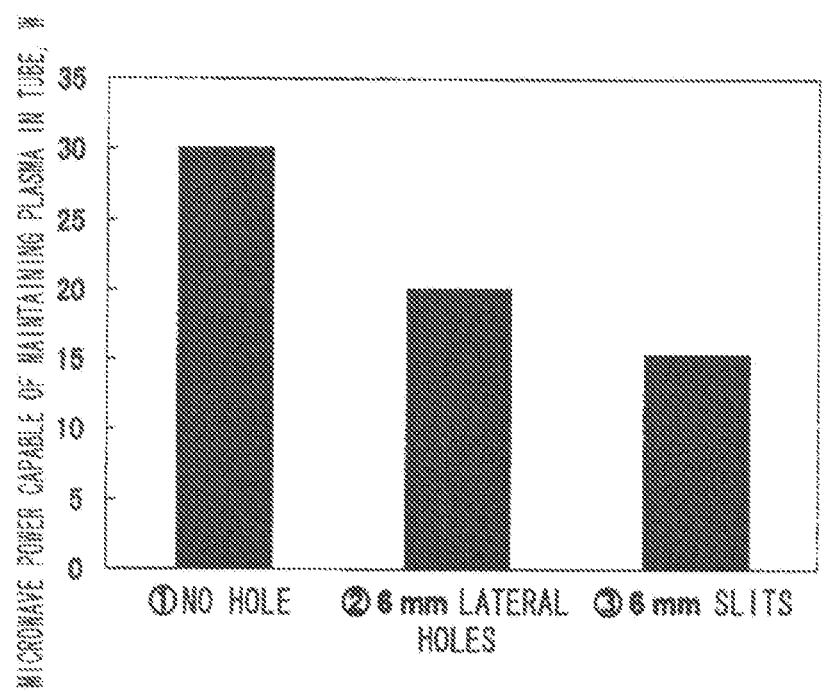
FIG. 31 is a diagram for illustrating comparison among the measurement results of the embodiments and the comparative example of the present invention.
Figure 32:
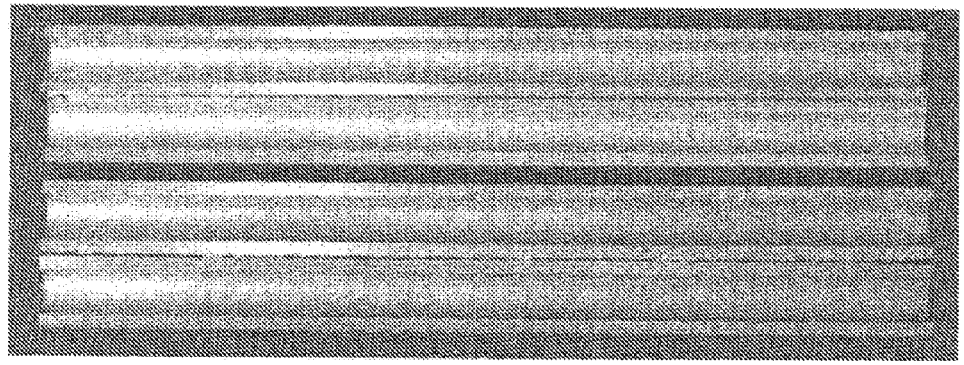
FIG. 32 shows images of the inner surface of a small-opening-diameter tube 20 subjected to plasma processing by using a plasma processing device 2 of an embodiment of the present invention.
Figure 33:
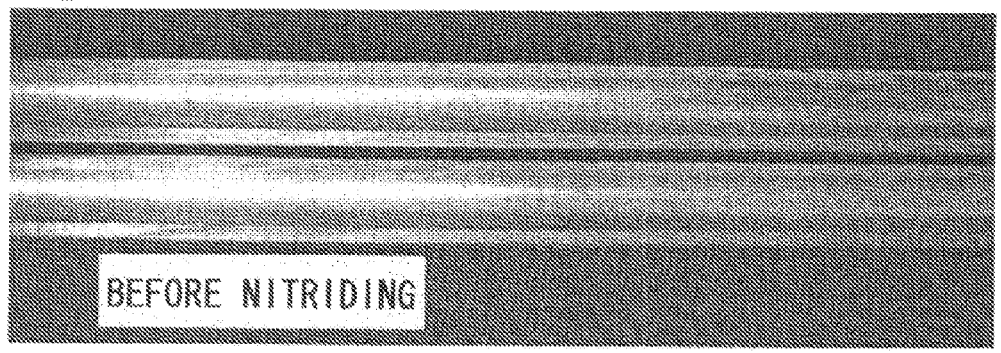
FIG. 33 shows images of the inner surface of the small-opening-diameter tube 20 before plasma processing was performed.
Figure 34:
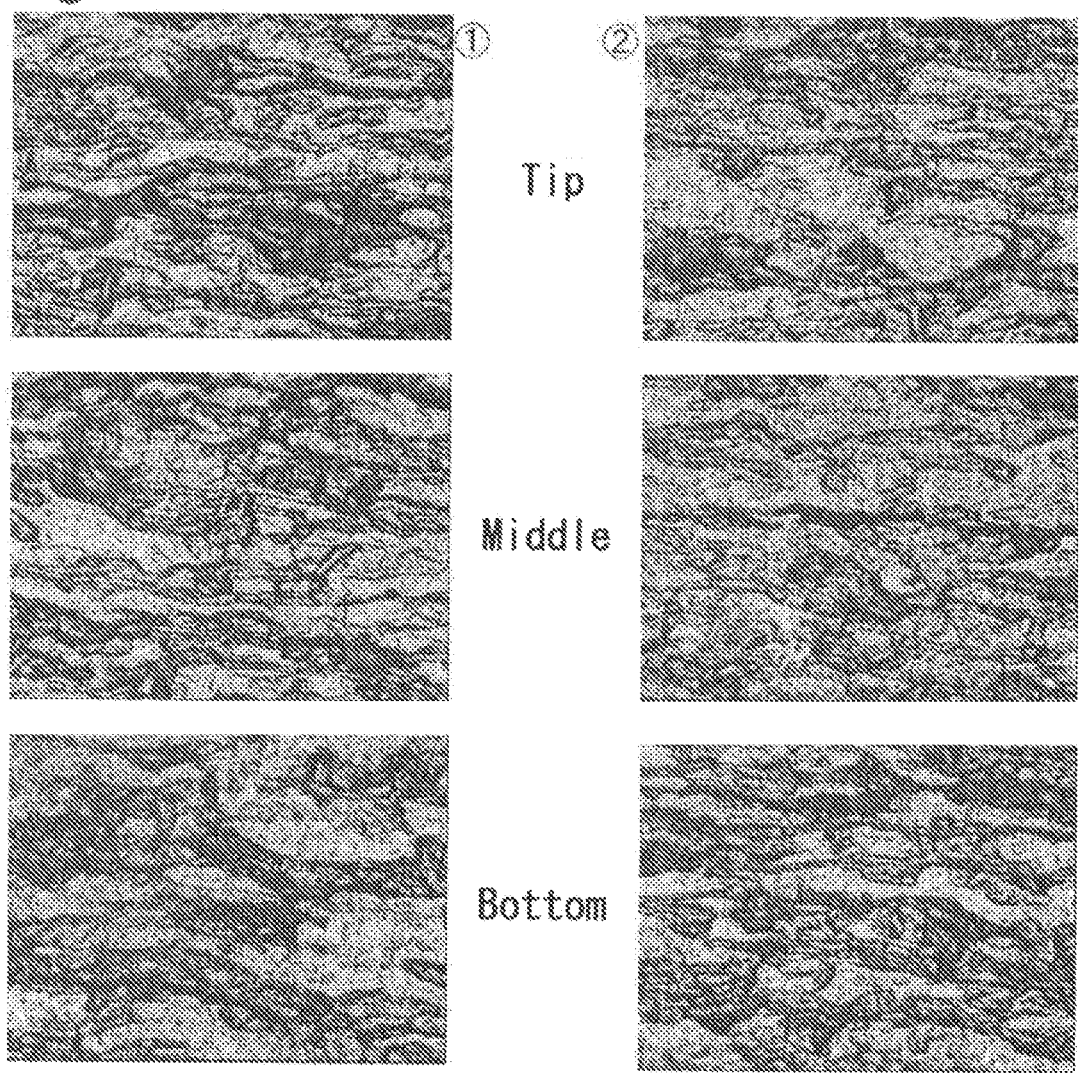
FIG. 34 shows microscope images of the inner surface of the small-opening-diameter tube 20 subjected to plasma processing by using a plasma processing device 2 of an embodiment of the present invention.

DESCRIPTION OF REFERENCE NUMERALS 2 plasma processing device
4 chamber
6 microwave generation device
16 quartz tube
18 tube holder
20 small-opening-diameter tube
22 bias power supply
24 voltmeter
26 ammeter
28 large diameter portion
30 small diameter portion

The invention claimed is:

1. A plasma processing device, comprising:
a chamber;
microwave generating means for generating a microwave;
microwave introducing means for introducing the microwave generated by said microwave generating means from outside of said chamber to inside of said chamber; and
bias voltage applying means for applying a bias voltage to a member having a cylindrical portion to be processed which is provided in said chamber, characterized in that
said plasma processing device further comprises a microwave increasing device provided between said microwave introducing means and said member having the cylindrical portion to be processed for introducing the microwave, which has been introduced into said chamber by said microwave introducing means and which exists outside said member having the cylindrical portion to be processed, into said member having the cylindrical portion to be processed and increasing an amount of microwave that is absorbed by plasma in said member having the cylindrical portion to be processed,
the cylindrical portion to be processed as an object of plasma processing is an inner surface of said member having the cylindrical portion to be processed,
said member having the cylindrical portion to be processed has at least one open end and the inner surface in a shape that extends from the open end to a side opposite to the microwave introducing means,
said microwave increasing device is a metal member having a hollow inside and that has an opening as an inlet for the microwave in said chamber and said microwave increasing device is provided at the open end of said member having the cylindrical portion to be processed,
said microwave increasing device introduces the microwave outside said member having the cylindrical portion to be processed through said opening and further introduces the microwave to the side opposite to said microwave introducing means on the inner surface side of said member having the cylindrical portion to be processed; and
said microwave increasing device is set in direct contact with said member having the cylindrical portion to be processed to support said member having the cylindrical portion to be processed such that the hollow of said microwave increasing device communicates with an inside space of said member having the cylindrical portion to be processed.

2. A plasma processing device according to claim 1, characterized in that said microwave increasing device has an opening that is formed in a side surface of said member having the cylindrical portion to be processed, and said opening is covered by said microwave introducing means.

3. A plasma processing device according to claim 2, characterized in that the opening of said microwave increasing device is a slit that is open to the microwave introducing means side.

4. A plasma processing device according to claim 3, characterized in that said microwave increasing device is provided with at least two slits or holes.

5. A plasma processing device according to claim 4, characterized in that said at least two slits or holes are provided at opposing positions to each other.

6. A plasma processing device according to claim 2, characterized in that the opening of said microwave increasing device is a hole of a predetermined shape.

7. A plasma processing device according to claim 1, characterized in that said microwave increasing device has an opening formed in a side surface thereof and that holds at a predetermined position in said chamber said member having the cylindrical portion to be processed, and said opening is covered by said microwave introducing means.

8. A plasma processing device according to claim 7, characterized in that said microwave increasing device is open at both ends.

9. A plasma processing device according to claim 1, characterized in that said microwave introducing means is made of a dielectric material.

10. A plasma processing device according to claim 9, characterized in that said microwave introducing means is made of quartz.

11. A plasma processing device according to claim 1, characterized by using one of argon plasma, nitrogen plasma, and hydrocarbon plasma.

12. A plasma processing device according to claim 1, characterized in that one of a $SiO_2$ film, a DLC film, and a nitride film is coated or formed on the inner surface of said member having the cylindrical portion to be processed.

13. A plasma processing device according to claim 1, characterized in that said member having the cylindrical portion to be processed is used for any of a gas pipe, a cylinder member, a valve member, and a hole in a mold.

14. A plasma processing device, comprising:
a chamber;
microwave generating means for generating a microwave;

microwave introducing means for introducing the microwave generated by said microwave generating means from outside of said chamber to inside of said chamber; and bias voltage applying means for applying a bias voltage to a member having an open end and a cylindrical portion to be processed which is provided in said chamber, characterized in that said plasma processing device further comprises a microwave increasing device provided between said microwave introducing means and said member having the cylindrical portion to be processed, said microwave increasing device being disposed such that the microwave introduced into said chamber by said microwave introducing means and that exists outside of said member having the cylindrical portion to be processed enters into said member having the cylindrical portion to be processed at said open end, thereby increasing an amount of microwave that is absorbed by plasma in the cylindrical portion to be processed;

the cylindrical portion to be processed as an object of plasma processing is an inner surface of said member having the cylindrical portion to be processed, said member having the cylindrical portion to be processed has at least one open end and the inner surface in a shape that extends from the open end to a side opposite to the microwave introducing means, said microwave increasing device is a metal member having a hollow inside and that has an opening as an inlet for the microwave in said chamber and said microwave increasing device is provided at the open end of said member having the cylindrical portion to be processed, said microwave increasing device introduces the microwave outside said member having the cylindrical portion to be processed into inside of said member having the cylindrical portion to be processed through said opening and further introduces the microwave to the side opposite to said microwave introducing means on the inner surface side of said member having the cylindrical portion to be processed; and said microwave increasing device is set in direct contact with said member having the cylindrical portion to be processed to support said member having the cylindrical portion to be processed such that the hollow of said microwave increasing device communicates with an inside space of said member having the cylindrical portion to be processed.

* * * * *